United States Patent
Yamagami

(10) Patent No.: US 8,625,370 B2
(45) Date of Patent: Jan. 7, 2014

(54) SEMICONDUCTOR INTEGRATED CIRCUIT

(75) Inventor: Yoshinobu Yamagami, Osaka (JP)

(73) Assignee: Panasonic Corporation, Osaka (JP)

( * ) Notice: Subject to any disclaimer, the term of this patent is extended or adjusted under 35 U.S.C. 154(b) by 43 days.

(21) Appl. No.: 13/218,235

(22) Filed: Aug. 25, 2011

(65) Prior Publication Data

US 2011/0310684 A1 Dec. 22, 2011

Related U.S. Application Data

(63) Continuation of application No. PCT/JP2009/005927, filed on Nov. 6, 2009.

(30) Foreign Application Priority Data

Mar. 5, 2009 (JP) .................................. 2009-051652

(51) Int. Cl.
*G11C 7/00* (2006.01)

(52) U.S. Cl.
USPC ........... 365/194; 365/196; 365/205; 365/207; 327/112; 327/205; 327/206; 327/409; 327/412

(58) Field of Classification Search
USPC .......... 365/194, 196, 205, 207; 327/112, 205, 327/206, 409, 412
See application file for complete search history.

(56) References Cited

U.S. PATENT DOCUMENTS

| | | | | |
|---|---|---|---|---|
| 4,687,954 A * | 8/1987 | Yasuda et al. | ................. | 327/206 |
| 5,835,423 A | 11/1998 | Harima | | |
| 6,741,508 B2 * | 5/2004 | Song et al. | ..................... | 365/196 |
| 7,193,907 B2 * | 3/2007 | Nakatake et al. | ........ | 365/189.09 |
| 2003/0048162 A1 | 3/2003 | Pietsch et al. | | |
| 2003/0117185 A1 | 6/2003 | Ishibashi et al. | | |
| 2003/0128608 A1 | 7/2003 | Song et al. | | |
| 2003/0206448 A1 | 11/2003 | Sung et al. | | |
| 2005/0104627 A1 * | 5/2005 | Song et al. | ..................... | 327/51 |
| 2008/0253172 A1 | 10/2008 | Yamagami | | |

FOREIGN PATENT DOCUMENTS

| | | |
|---|---|---|
| JP | 9-282889 | 10/1997 |
| JP | 2002-231890 | 8/2002 |
| JP | 2003-195992 | 7/2003 |
| JP | 2003-218239 | 7/2003 |
| JP | 2003-331582 | 11/2003 |
| JP | 2008-072197 | 3/2008 |
| JP | 2008-072197 A | 3/2008 |

* cited by examiner

*Primary Examiner* — Thao Bui

(74) *Attorney, Agent, or Firm* — McDermott Will & Emery LLP

(57) ABSTRACT

A semiconductor integrated circuit includes a P-type MOS transistor and two or more N-type MOS transistors connected together in series between a first and a second power supply, an input terminal connected to a gate terminal of the P-type MOS transistor and gate terminals of the two or more N-type MOS transistors, an output terminal which is a connection node between the P-type MOS transistor and one of the two or more N-type MOS transistors connected to the P-type MOS transistor, and one or more capacitors connected to the output terminal. The drive capability of the P-type MOS transistor is higher than the overall drive capability of the two or more N-type MOS transistors connected together in series. Therefore, a semiconductor integrated circuit is provided in which fluctuations in the delay time of a delay circuit caused by variations in transistor characteristics can be reduced.

17 Claims, 11 Drawing Sheets

SEMICONDUCTOR INTEGRATED CIRCUIT

CROSS-REFERENCE TO RELATED APPLICATIONS

This is a continuation of PCT International Application PCT/JP2009/005927 filed on Nov. 6, 2009, which claims priority to Japanese Patent Application No. 2009-051652 filed on Mar. 5, 2009. The disclosures of these applications including the specifications, the drawings, and the claims are hereby incorporated by reference in their entirety.

BACKGROUND

The present disclosure relates to delay circuits used in semiconductor integrated circuits, and more particularly, to techniques of reducing fluctuations in delay time of delay circuits caused by variations in transistor characteristics.

In recent years, as semiconductor microfabrication technology has progressed, variations in characteristics of transistors etc. included in semiconductor integrated circuits have increased.

Conventionally, Japanese Patent Publication No. 2003-218239 describes an example delay circuit provided in an SRAM including a sense amplifier drive circuit (ibid, FIG. 1). The delay circuit includes a plurality of delay inverters (ibid, FIG. 9) which are connected in series. In each delay inverter, the overall beta ratio (the ratio of the width to the entire length) of a plurality of NMOS transistors is equal to the beta ratio of a pass transistor (equivalent to an "access transistor" described herein) in a bit cell (equivalent to a "memory cell" described herein). As a result, the delay circuit has the good ability to follow changes in the voltage, temperature, etc. of the bit cell.

However, in Japanese Patent Publication No. 2003-218239, only fluctuations in characteristics of the NMOS transistor which is the pass transistor of the bit cell are taken into consideration, and fluctuations in the delay time of the delay inverter caused by fluctuations in characteristics of the PMOS transistor included in the delay inverter (ibid, FIG. 9) is not taken into consideration.

Fluctuations in transistor characteristics occur in the PMOS transistor as well as the NMOS transistor. In actual devices, some finished transistors have low or high performance, i.e., there are variations in transistor characteristics.

For the delay inverter (delay circuit) of Japanese Patent Publication No. 2003-218239, only fluctuations in characteristics of the NMOS transistor are taken into consideration. Therefore, there is a difference in the delay time of the delay inverter between when the performance of the NMOS transistor is low and the performance of the PMOS transistor is high (condition 1) and when the performance of the NMOS transistor is low and the performance of the PMOS transistor is also low (condition 2).

For example, when data read from a memory cell in an SRAM is amplified by a sense amplifier, a delay circuit is used as a timing generator which generates timing signals for activating a word line, activation of a sense amplifier, etc. In the delay circuit of Japanese Patent Publication No. 2003-218239, the delay time is determined based on characteristics of both the NMOS transistor and the PMOS transistor. Therefore, it is clear that the delay time of the delay circuit under the condition 2 is longer than the delay time of the delay circuit under the condition 1.

In contrast to this, the speed at which data is read from an SRAM memory cell is determined by only the NMOS transistor (the access transistor and the drive transistor), and is not affected by the characteristics of the PMOS transistor. Therefore, the read speed does not change regardless of whether the finished NMOS and PMOS transistors satisfy the condition 1 or the condition 2.

The timing of activation of the sense amplifier is designed so that the sense amplifier can normally amplify data even under the condition 1 which causes the delay time of the delay circuit to be shorter. Conversely, the access time of the SRAM is determined by the condition 2 which causes the delay time of the delay circuit to be longer. Therefore, if there is a difference in the delay time of the delay circuit between the conditions 1 and 2 as in Japanese Patent Publication No. 2003-218239, the access time is disadvantageously increased. Moreover, the amount of a charging/discharging current of a non-selected memory cell from/to a bit line increases, disadvantageously leading to an increase in power consumption.

SUMMARY

The present disclosure describes implementations of a semiconductor integrated circuit in which fluctuations in the delay time of the delay circuit caused by variations in transistor characteristics can be reduced, and which is substantially resistant to process variations during fabrication and has excellent layout flexibility and a small area.

An example semiconductor integrated circuit includes a P-type MOS transistor and two or more N-type MOS transistors connected together in series between a first and a second power supply, an input terminal connected to a gate terminal of the P-type MOS transistor and gate terminals of the two or more N-type MOS transistors, an output terminal which is a connection node between the P-type MOS transistor and one of the two or more N-type MOS transistors connected to the P-type MOS transistor, and one or more capacitors connected to the output terminal. The drive capability of the P-type MOS transistor is higher than the drive capability of the two or more N-type MOS transistors connected together in series.

In this case, the drive capability of the P-type MOS transistor may be twice or more as high as the overall drive capability of the two or more N-type MOS transistors connected together in series.

When all the P-type MOS transistor and the two or more N-type MOS transistors have the same channel length, the channel width of the P-type MOS transistor may be four times or more as large as a value which is obtained by dividing the channel width of the N-type MOS transistor by the number of the two or more N-type MOS transistors connected together in series.

When all the P-type MOS transistor and the two or more N-type MOS transistors have the same channel width, the channel length of the P-type MOS transistor may be one fourth or less of a value which is obtained by multiplying the channel length of the N-type MOS transistor by the number of the two or more N-type MOS transistors connected together in series.

In addition, the substrate potentials of the P-type MOS transistor and the two or more N-type MOS transistors may be separately controlled.

The semiconductor integrated circuit may further include one or more P-type MOS transistors each having a gate terminal connected to the input terminal, and each connected between a connection node between the corresponding two of the two or more N-type MOS transistors connected together in series and the first power supply.

The semiconductor integrated circuit may further include one or more P-type MOS transistors each having a gate terminal connected to the input terminal, and each connected between a connection node between the corresponding two of the two or more N-type MOS transistors connected together in series and the output terminal.

In addition, the one or more capacitors may each include at least one P-type or N-type MOS transistor. If at least one of the one or more capacitors includes the P-type MOS transistor and at least another one of the one or more capacitors includes the N-type MOS transistor, the capacitance value of the at least one capacitor including the P-type MOS transistor may be smaller than the capacitance value of the at least one capacitor including the N-type MOS transistor, and the product of the channel length and channel width of the at least one capacitor including the P-type MOS transistor may be smaller than the product of the channel length and channel width of the at least one capacitor including the N-type MOS transistor.

Another example semiconductor integrated circuit includes two or more P-type MOS transistors and an N-type MOS transistor connected together in series between a first and a second power supply, an input terminal connected to a gate terminal of the N-type MOS transistor and gate terminals of the two or more P-type MOS transistors, and an output terminal which is a connection node between the N-type MOS transistor and one of the two or more P-type MOS transistors connected to the N-type MOS transistor, and one or more capacitors connected to the output terminal. The drive capability of the N-type MOS transistor is higher than the drive capability of the two or more P-type MOS transistors connected together in series.

In this case, the drive capability of the N-type MOS transistor may be twice or more as high as the overall drive capability of the two or more P-type MOS transistors connected together in series.

When all the two or more P-type MOS transistors and the N-type MOS transistor have the same channel length, the channel width of the N-type MOS transistor may be larger than or equal to a value which is obtained by dividing the channel width of the P-type MOS transistor by the number of the two or more P-type MOS transistors connected together in series.

When all the two or more P-type MOS transistors and the N-type MOS transistors have the same channel width, the channel length of the N-type MOS transistor may be smaller than or equal to a value which is obtained by multiplying the channel length of the P-type MOS transistor by the number of the two or more P-type MOS transistors connected together in series.

In addition, the substrate potentials of the two or more P-type MOS transistor and the N-type MOS transistor may be separately controlled.

The semiconductor integrated circuit may further include one or more N-type MOS transistors each having a gate terminal connected to the input terminal, and each connected between a connection node between the corresponding two of the two or more P-type MOS transistors connected together in series and the second power supply.

The semiconductor integrated circuit may further include one or more N-type MOS transistors each having a gate terminal connected to the input terminal, and each connected between a connection node between the corresponding two of the two or more P-type MOS transistors connected together in series and the output terminal.

In addition, the one or more capacitors may each include at least one P-type or N-type MOS transistor. If at least one of the one or more capacitors includes the P-type MOS transistor and at least another one of the one or more capacitors includes the N-type MOS transistor, the capacitance value of the at least one capacitor including the P-type MOS transistor may be larger than the capacitance value of the at least one capacitor including the N-type MOS transistor, and the product of the channel length and channel width of the at least one capacitor including the P-type MOS transistor may be larger than the product of the channel length and channel width of the at least one capacitor including the N-type MOS transistor.

When the semiconductor integrated circuit is mounted in a semiconductor storage device, the polarity of the transistors connected together in series may be the same as the polarity of one of transistors connected together in series between a bit line and the first or second power supply in the semiconductor storage device, the one transistor being connected to the bit line.

When the semiconductor integrated circuit is mounted in a semiconductor storage device, the number of the transistors connected together in series may be the same as the number of transistors connected together in series between a bit line and the first or second power supply in the semiconductor storage device.

In addition, when the semiconductor integrated circuit is mounted in a semiconductor storage device, the transistors connected together in series may have the same impurity concentration as that of a transistor connected to a bit line in the semiconductor storage device.

When the semiconductor integrated circuit is mounted in a semiconductor storage device in which a potential of a memory array is different from a potential of a portion thereof other than the memory array, the first potential applied to the semiconductor integrated circuit may be equal to the potential of the memory array.

The semiconductor integrated circuit may be used as a delay circuit which generates a timing signal for activating a sense amplifier circuit which amplifies data read from a memory cell in a semiconductor storage device, or as a delay circuit which generates a timing signal for writing data to a memory cell in a semiconductor storage device.

In addition, the one or more P-type MOS transistors other than the P-type MOS transistors included in the one or more capacitors may have the same channel width and the same channel length. The one or more N-type MOS transistors other than the N-type MOS transistors included in the one or more capacitors may have the same channel width and the same channel length.

The one or more P-type MOS transistors other than the P-type MOS transistors included in the one or more capacitors may have gate electrodes arranged in parallel to each other. A diffusion region shaped by at least the one or more P-type MOS transistors other than the P-type MOS transistors included in the one or more capacitors may be in the shape of a rectangle. The one or more N-type MOS transistors other than the N-type MOS transistors included in the one or more capacitors may have gate electrodes arranged in parallel to each other. A diffusion region shaped by at least the one or more N-type MOS transistors other than the N-type MOS transistors included in the one or more capacitors may be in the shape of a rectangle.

A P-well and an N-well may be provided and separated from each other in a direction perpendicular to the channel direction of the transistors. The P-type MOS transistors other than those included in the capacitors may be provided in the P-well, and the N-type MOS transistors other than those included in the capacitors may be provided in the N-well. The capacitors may be provided adjacent to the P-type MOS transistors or the N-type MOS transistors. The capacitors may be provided in a region having a length in the direction perpendicular to the transistor channel direction which is smaller than or equal to that of a region where the P-type MOS transistors or the N-type MOS transistors are formed. The capacitance value of the capacitor may be changed by changing a size thereof in the same direction as the transistor channel direction while keeping a length thereof in the direction perpendicular to the transistor channel direction.

In addition, a P-well and an N-well may be separated from each other in a direction perpendicular to the channel direction of the transistors. The P-type MOS transistors other than those included in the capacitors may be provided in the P-well, and the N-type MOS transistors other than those included in the capacitors are provided in the N-well. The capacitors may be provided adjacent to the P-type MOS transistors or the N-type MOS transistors. The capacitors may be provided in a region having a length in the same direction as the transistor channel direction which is smaller than or equal to that of a region where the P-type MOS transistors or the N-type MOS transistors are formed. The capacitance value of the capacitor may be changed by changing a size thereof in the direction perpendicular to the transistor channel direction while keeping a length thereof in the same direction as the transistor channel direction.

As described above, in the semiconductor integrated circuit of the present disclosure, fluctuations in the delay time of the delay circuit caused by variations in transistor characteristics can be reduced. The semiconductor integrated circuit of the present disclosure is also substantially resistant to process variations during fabrication and has excellent layout flexibility and a small area.

DETAILED DESCRIPTION

Figure 1:
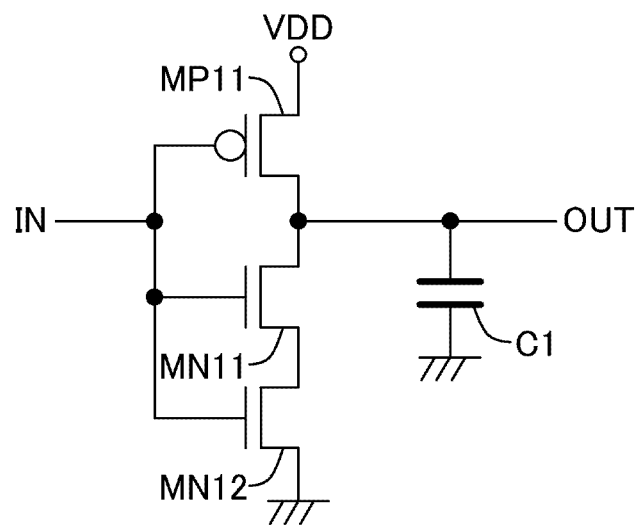
FIG. 1 is a circuit diagram showing a configuration of a semiconductor integrated circuit according to a first embodiment of the present disclosure.

Embodiments of the present disclosure will be described in detail hereinafter with reference to the accompanying drawings. Like parts are indicated by like reference characters.

First Embodiment

FIG. 1 is a diagram showing a configuration of a semiconductor integrated circuit according to a first embodiment of the present disclosure.

The semiconductor integrated circuit of FIG. 1 includes a P-type MOS transistor MP11, N-type MOS transistors MN11 and MN12, and a capacitor C1. A reference character IN indicates an input terminal, a reference character OUT indicates an output terminal, and a reference character VDD indicates a power supply.

The P-type MOS transistor MP11 has a gate terminal connected to the input terminal IN, a source terminal connected to the power supply VDD, and a drain terminal connected to the output terminal OUT. The N-type MOS transistors MN11 and MN12 each have a gate terminal connected to the input terminal IN, and are connected together in series between the output terminal OUT and a ground power supply. The N-type MOS transistor MN11 has a drain terminal connected to the output terminal OUT, and the N-type MOS transistor MN12 has a source terminal connected to the ground power supply. The capacitor C1 is connected between the output terminal OUT and the ground power supply.

Operation of the semiconductor integrated circuit of this embodiment thus configured will be described hereinafter.

Firstly, a case where a low level voltage is applied to the input terminal IN will be described. In this case, the P-type MOS transistor MP11 is turned on, and the N-type MOS transistors MN11 and MN12 are turned off, so that a high level voltage is output to the output terminal OUT. In this case, because the capacitor C1 is connected to the output terminal OUT, there is a delay in outputting the high level voltage to the output terminal OUT. The delay time is determined by the capacitance of the capacitor C1 (strictly speaking, the drain capacitances of the P-type MOS transistor MP11 and the N-type MOS transistor MN11, etc., are included) and the drive capability of the P-type MOS transistor.

Conversely, when a high level voltage is applied to the input terminal IN, the P-type MOS transistor MP11 is turned off, and the N-type MOS transistors MN11 and MN12 are turned on, so that a low level voltage is output to the output terminal OUT. In this case, because the capacitor C1 is connected to the output terminal OUT, there is a delay in outputting the low level voltage to the output terminal OUT. The delay time is determined by the capacitance of the capacitor C1 and the overall drive capability of the N-type MOS transistors MN11 and MN12 connected together in series.

As used herein, the term "drive capability" with respect to a transistor refers to the absolute value of a saturated current of the transistor. The saturated current of a transistor is changed by controlling the channel width and channel length of the transistor. For typical MOS transistors, if a P-type MOS transistor and an N-type MOS transistor have the same channel length and the same channel width, the drive capability of the N-type MOS transistor is about twice as high as the drive capability of the P-type MOS transistor. In other words, if a P-type MOS transistor and an N-type MOS transistor have the same channel length, then when the channel width of the P-type MOS transistor is twice as large as the channel width of the N-type MOS transistor, the P-type MOS transistor and the N-type MOS transistor have almost the same drive capability.

As described above, the semiconductor integrated circuit of FIG. 1 is a delay device which outputs the inverted level of a signal input to the input terminal IN to the output terminal OUT after a delay time which is determined by the capacitance of the output terminal OUT and the drive capability of the MOS transistor corresponding to the level of the signal input to the input terminal IN. By providing a plurality of the circuits of FIG. 1 which are connected together in series, any delay time can be obtained. Of course, any delay time can also be obtained by changing the capacitance C1 of the capacitor or the drive capability of each transistor.

In the above description, it is clear that even if the gate terminal of one of the N-type MOS transistors MN11 and MN12 connected together in series is fixed to the high level, the same operation is achieved. It is also clear that even if the number of the N-type MOS transistors connected together in series is increased, the same operation is achieved. Although the capacitor C1 is connected to the ground power supply in FIG. 1, it is clear that even if the capacitor C1 is connected to any fixed potential, the same operation is achieved.

In actual devices, there are variations in transistor characteristics, e.g., some transistors have a low drive capability, or conversely, some transistors have a high drive capability.

For example, in a finished product, operation in a case where an N-type MOS transistor has a low drive capability and a P-type MOS transistor has a high drive capability (condition 1) will be compared with operation in a case where an N-type MOS transistor has a low drive capability and a P-type MOS transistor also has a low drive capability (condition 2).

It is assumed that a signal which transitions from the high level to the low level is input to the input terminal IN.

The output terminal OUT transitions from the low level to the high level after a delay time which is determined by the capacitance of the output terminal OUT and the drive capability of the P-type MOS transistor MP11.

Under the condition 1, the P-type MOS transistor MP11 which transitions from the off state to the on state has a high drive capability, and therefore, the delay time is short. In contrast to this, under the condition 2, the P-type MOS transistor MP11 which transitions from the off state to the on state has a low drive capability, and therefore, the delay time is long.

When a signal which transitions from the low level to the high level is input to the input terminal IN, there is not a difference in delay time between the conditions 1 and 2. This is because, although the delay time depends on the overall drive capability of the N-type MOS transistors MN11 and MN12 which transition from the off state to the on state, there is not a difference in the overall drive capability of the N-type MOS transistors MN11 and MN12 between the conditions 1 and 2.

In other words, between the conditions 1 and 2 of the finished transistors, a difference in the delay time of the delay circuit occurs only due to a change in characteristics of the P-type MOS transistor MP11.

Thus, there is not a difference in the overall drive capability of the N-type MOS transistors MN11 and MN12 between the conditions 1 and 2. Therefore, in order to reduce the difference in the delay time of the delay circuit between the conditions 1 and 2, the drive capability of the P-type MOS transistor MP11 may be previously set to be higher than the overall drive capability of the N-type MOS transistors MN11 and MN12.

In the configuration of FIG. 1, the two N-type MOS transistors are connected together in series. If the N-type MOS transistors MN11 and MN12 have the same drive capability, the overall drive capability of the N-type MOS transistors provided between the output terminal OUT and the ground power supply has half the drive capability of one N-type MOS transistor. Alternatively, if a plurality of N-type MOS transistors having the same drive capability are connected together in series, the overall drive capability of the N-type MOS transistors provided between the output terminal OUT and the ground power supply has a value which is obtained by dividing the drive capability of one N-type MOS transistor by the number of the N-type MOS transistors connected together in series.

The present inventor has studied characteristics of actual delay circuits under the conditions 1 and 2, under the same temperature and voltage conditions, based on the theory that if a P-type MOS transistor and an N-type MOS transistor have the same channel width and the same channel length, the drive capability of the N-type MOS transistor is about twice as high as the drive capability of the P-type MOS transistor. As a result, it was found that if the drive capability of the P-type MOS transistor is equal to the overall drive capability of the N-type MOS transistors, the ratio of the delay time of the delay circuit under the condition 1 to the delay time of the delay circuit under the condition 2 is 70%. If the drive capability of the P-type MOS transistor is twice or more as high as the overall drive capability of the N-type MOS transistors, the ratio of the delay time of the delay circuit under the condition 1 to the delay time of the delay circuit under the condition 2 is improved to 80% or more. Note that as the ratio of the delay time of the delay circuit under the condition 1 to the delay time of the delay circuit under the condition 2 is closer to 100%, the difference in the delay time of the delay circuit between the conditions 1 and 2 is further reduced.

As described above, if the drive capability of the P-type MOS transistor is twice or more as high as the overall drive capability of the N-type MOS transistors, fluctuations in the delay time of the delay circuit caused by variations in transistor characteristic can be reduced.

A relationship between the drive capability of the P-type MOS transistor and the overall drive capability of the N-type MOS transistors is represented using the channel widths and channel lengths of the transistors as follows. Here, it is assumed that the drive capability of each N-type MOS transistor is about twice as high as the drive capability of the P-type MOS transistor, and all the N-type MOS transistors connected together in series have the same size.

Firstly, it is assumed that all the transistors have the same channel length. In this case, the channel width of the P-type MOS transistor may be set to be four times or more as large as a value which is obtained by dividing the channel width of one N-type MOS transistor by the number of the N-type MOS transistors connected together in series.

Next, it is assumed that all the transistors have the same channel width. In this case, the channel length of the P-type MOS transistor may be set to be one fourth or less of a value which is obtained by multiplying the channel length of one N-type MOS transistor by the number of the N-type MOS transistors connected together in series.

Second Embodiment

Figure 2:
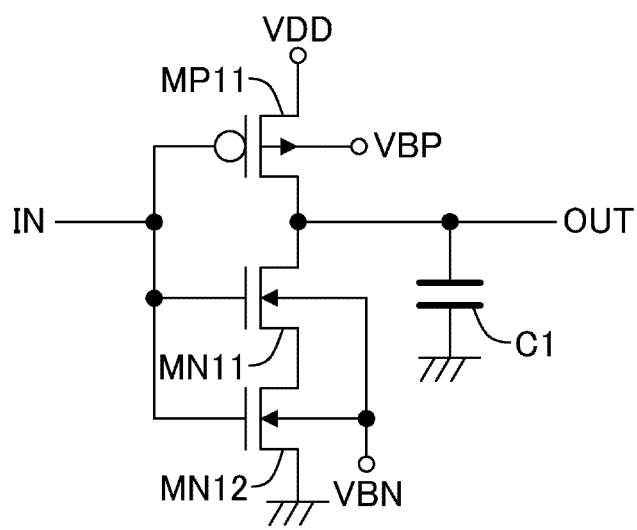
FIG. 2 is a circuit diagram showing a configuration of a semiconductor integrated circuit according to a second embodiment of the present disclosure.

FIG. 2 is a diagram showing a configuration of a semiconductor integrated circuit according to a second embodiment of the present disclosure.

The configuration of FIG. 2 is similar to that of FIG. 1, except that a substrate node of the P-type MOS transistor MP11 is connected to a substrate potential VBP, and substrate nodes of the N-type MOS transistors MN11 and MN12 are connected to a substrate potential VBN.

The drive capability of a MOS transistor can be changed by changing the substrate potential of the MOS transistor.

Typically, if a potential which is lower than the power supply VDD at the source terminal is applied to a P-type MOS transistor (forward bias), the drive capability of the P-type MOS transistor increases. If a potential which is lower than the ground power supply at the source terminal is applied to an N-type MOS transistor (backward bias), the drive capability of the N-type MOS transistor decreases.

In other words, if a potential which is lower than the power supply VDD is applied to the substrate node VBP of the P-type MOS transistor MP11, or a potential which is lower than the ground power supply is applied to the substrate node VBN of the N-type MOS transistors MN11 and MN12, the aforementioned drive capability ratio can be achieved by using transistors having a smaller size than that of the transistors of FIG. 1. As a result, a circuit having a smaller area can be obtained.

Although two N-type MOS transistors are connected together in series in the configuration of FIG. 2, it is clear that even if a plurality of N-type MOS transistors are connected together in series, similar operation and advantages are achieved. Moreover, it is not necessary to control the substrate potentials of all the N-type MOS transistors. It is clear that similar advantages are achieved even if the substrate potentials of only some of the N-type MOS transistors are controlled.

Third Embodiment

Figure 3:
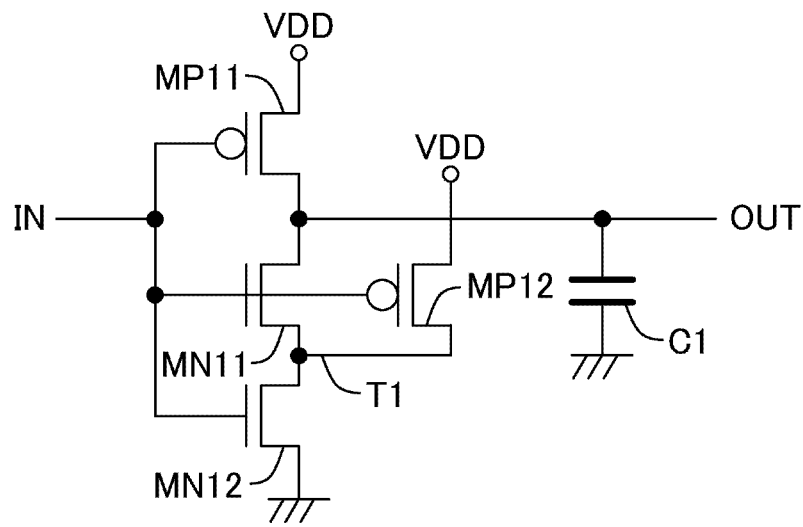
FIG. 3 is a circuit diagram showing a configuration of a semiconductor integrated circuit according to a third embodiment of the present disclosure.

FIG. 3 is a diagram showing a configuration of a semiconductor integrated circuit according to a third embodiment of the present disclosure.

The configuration of FIG. 3 is similar to that of FIG. 1, except that a P-type MOS transistor MP12 having a gate terminal connected to the input terminal IN is further provided between the power supply VDD and a connection node T1 between the N-type MOS transistors MN11 and MN12 connected together in series.

Operation of the semiconductor integrated circuit of this embodiment will be described.

Firstly, when the low level voltage is applied to the input terminal IN, the P-type MOS transistor MP12 is turned on, so that the connection node T1 between the N-type MOS transistors MN11 and MN12 transitions to the high level. In this case, because the N-type MOS transistors MN11 and MN12 are off, the configuration of FIG. 3 performs the same operation as that of the configuration of FIG. 1.

Next, when the high level voltage is applied the input terminal IN, the P-type MOS transistor MP12 is turned off, so that the N-type MOS transistors MN11 and MN12 are not affected. In this case, therefore, the configuration of FIG. 3 performs the same operation as that of the configuration of FIG. 1.

As described above, the configuration of FIG. 3 performs the same operation as that of the configuration of FIG. 1.

In the configuration of FIG. 1, when the input terminal IN is at the low level, the potential of the connection node T1 between the N-type MOS transistors MN11 and MN12 has an indefinite level because both the N-type MOS transistors MN11 and MN12 are turned off. Therefore, when the input terminal IN transitions from the low level to the high level, so that the N-type MOS transistors MN11 and MN12 transition from the off state to the on state, fluctuations in the delay time occur due to the potential state of the connection node T1.

Therefore, as shown in FIG. 3, if the P-type MOS transistor MP12 having a gate terminal connected to the input terminal IN is further provided between the power supply VDD and the connection node T1 between the N-type MOS transistors MN11 and MN12 connected together in series, the connection node T1 is invariably at the high level during the period of time that the N-type MOS transistors MN11 and MN12 are off, whereby the delay time can be caused to be more stable.

In the configuration of FIG. 3, two N-type MOS transistors are connected together in series. It is clear that even if a plurality of N-type MOS transistors are connected together in series, and a P-type MOS transistor having a gate terminal connected to the input terminal IN is provided between the power supply VDD and a connection node between each N-type MOS transistor, the same operation and advantages can be achieved.

Moreover, it is clear that even if the substrate node control described in the second embodiment is applied to this embodiment, advantages similar to those of the second embodiment are achieved.

Fourth Embodiment

Figure 4:
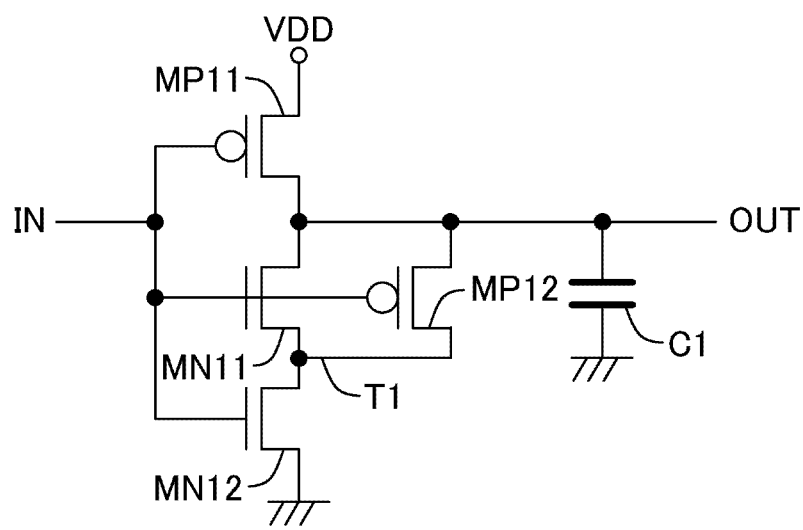
FIG. 4 is a circuit diagram showing a configuration of a semiconductor integrated circuit according to a fourth embodiment of the present disclosure.

FIG. 4 is a diagram showing a configuration of a semiconductor integrated circuit according to a fourth embodiment of the present disclosure.

The configuration of FIG. 4 is similar to that of FIG. 3, except that the source terminal of the P-type MOS transistor MP12 is connected to the output terminal OUT instead of the power supply VDD.

Operation of the semiconductor integrated circuit of this embodiment will be described.

Firstly, when the low level voltage is input to the input terminal IN, the P-type MOS transistor MP12 is turned on, so that the connection node T1 between the N-type MOS transistors MN11 and MN12 transitions to the high level. In this case, because the N-type MOS transistors MN11 and MN12 are turned off, the configuration of FIG. 4 performs operation similar to that of the configuration of FIG. 1.

Next, when the high level voltage is input to the input terminal IN, the P-type MOS transistor MP12 is turned off. In this case, the N-type MOS transistors MN11 and MN12 are not affected, and therefore, the configuration of FIG. 4 performs operation similar to that of the configuration of FIG. 1.

As described above, the configuration of FIG. 4 performs operation similar to that of the configuration of FIG. 1.

In the configuration of FIG. 1, when the input terminal IN is at the low level, the potential of the connection node T1 between the N-type MOS transistors MN11 and MN12 has an indefinite level because both the N-type MOS transistors MN11 and MN12 are off. Therefore, when the input terminal IN transitions from the low level to the high level, so that the N-type MOS transistors MN11 and MN12 transition from the off state to the on state, fluctuations in the delay time occur due to the potential state of the connection node T1.

Therefore, as shown in FIG. 4, if the P-type MOS transistor MP12 having a gate terminal connected to the input terminal IN is further provided between the output terminal OUT and the connection node T1 between the N-type MOS transistors MN11 and MN12 connected together in series, the connection node T1 is invariably at the high level during the period of time that the N-type MOS transistors MN11 and MN12 are off, whereby the delay time can be caused to be more stable.

Moreover, the P-type MOS transistor MP12 serves as an additional capacitor for the output terminal OUT. Therefore, the capacitance value of the capacitor C1 can be reduced in an amount corresponding to a capacitance value added by the P-type MOS transistor MP12, resulting in a reduction in area.

In the configuration of FIG. 4, two N-type MOS transistors are connected together in series. It is clear that even if a plurality of N-type MOS transistors are connected together in series, and a P-type MOS transistor having a gate terminal connected to the input terminal IN is further provided between the output terminal OUT and a connection node between each N-type MOS transistor, the same operation and advantages can be achieved.

Moreover, it is clear that even if the substrate node control described in the second embodiment is applied to this embodiment, advantages similar to those of the second embodiment are achieved.

Fifth Embodiment

Figure 5:
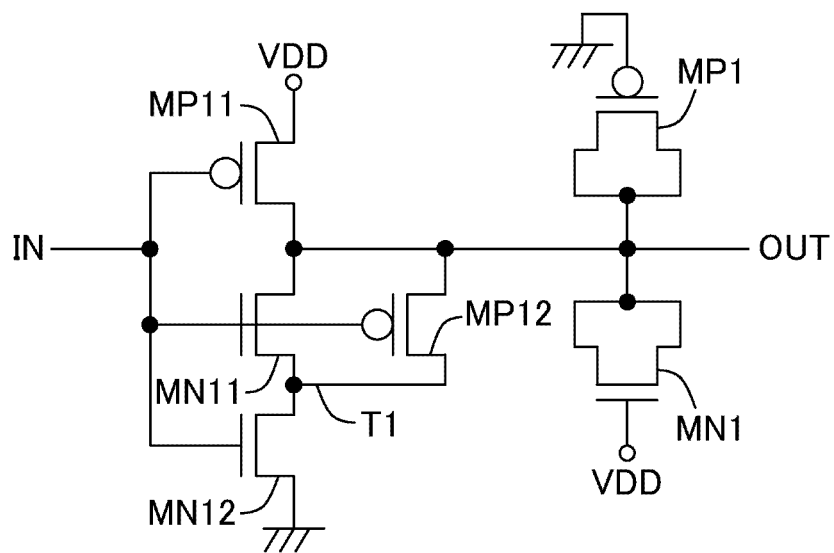
FIG. 5 is a circuit diagram showing a configuration of a semiconductor integrated circuit according to a fifth embodiment of the present disclosure.

FIG. 5 is a diagram showing a configuration of a semiconductor integrated circuit according to a fifth embodiment of the present disclosure.

The configuration of FIG. 5 is similar to that of FIG. 4, except that the capacitor C1 is replaced with a P-type MOS transistor MP1 and an N-type MOS transistor MN1 which serve as a capacitor.

The P-type MOS transistor MP1 has a gate terminal connected to the ground power supply, and a source terminal and a drain terminal connected to the output terminal OUT. The N-type MOS transistor MN1 has a gate terminal connected to the power supply VDD, and a source terminal and a drain terminal connected to the output terminal OUT.

Firstly, the semiconductor integrated circuit of this embodiment has a configuration similar to that of FIG. 4, only except that the capacitor C1 of FIG. 4 is replaced with transistors serving as a capacitor, and therefore, it is clear that the same operation and advantages as those of the fourth embodiment are achieved.

As also described in the first embodiment, in actual devices, there are variations in transistor characteristics, e.g., some transistors have a low drive capability, or conversely, some transistors have a high drive capability.

Typically, the drive capability of a transistor depends on the finished channel length of the transistor. If the finished channel length of the transistor is small, the drive capability of the transistor is high. Conversely, if the finished channel length of the transistor is large, the drive capability of the transistor is low.

Therefore, in a finished product, if an N-type MOS transistor has a low drive capability and a P-type MOS transistor has a high drive capability (condition 1) and if an N-type MOS transistor has a low drive capability and a P-type MOS transistor also has a low drive capability (condition 2), there is not a change in the finished channel length of the N-type MOS transistor, but there is a significant change in the finished channel length of the P-type MOS transistor.

When a P-type MOS transistor and an N-type MOS transistor which serve as a capacitor are provided as in this embodiment, the capacitance of the P-type MOS transistor may be set to be smaller than the capacitance of the N-type MOS transistor. Alternatively, only the N-type MOS transistor may be provided to serve as a capacitor.

As a result, fluctuations in the delay time of the delay circuit caused by variations in the capacitance value of the capacitor can be reduced.

Typically, a capacitor constructed by a MOS transistor as shown in FIG. 5 has a capacitance value which is proportional to the product of the channel length and channel width of the transistor. Here, if it is assumed that the P-type MOS transistor serving as a capacitor and the N-type MOS transistor serving as a capacitor have the same channel length and the same channel width, and therefore, have substantially the same capacitance value, the product of the channel length and channel width of the P-type MOS transistor serving as a capacitor may be set to be smaller than the product of the channel length and channel width of the N-type MOS transistor serving as a capacitor.

Sixth Embodiment

Figure 6:
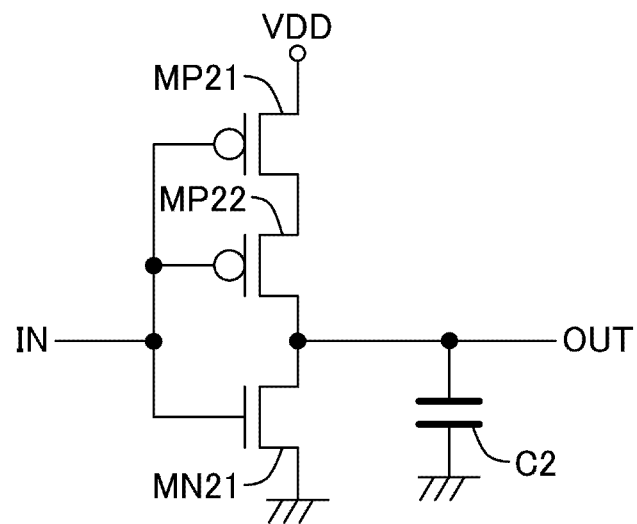
FIG. 6 is a circuit diagram showing a configuration of a semiconductor integrated circuit according to a sixth embodiment of the present disclosure.

FIG. 6 is a diagram showing a configuration of a semiconductor integrated circuit according to a sixth embodiment of the present disclosure.

The semiconductor integrated circuit of FIG. 6 includes an N-type MOS transistor MN21, P-type MOS transistors MP21 and MP22, and a capacitor C2. A reference character IN indicates an input terminal, a reference character OUT indicates an output terminal, and a reference character VDD indicates a power supply.

The N-type MOS transistor MN21 has a gate terminal connected to the input terminal IN, a source terminal connected to a ground power supply, and a drain terminal connected to the output terminal OUT. The P-type MOS transistors MP21 and MP22 each have a gate terminal connected to the input terminal IN, and are connected together in series between the power supply VDD and the output terminal OUT. The P-type MOS transistor MP22 has a drain terminal connected to the output terminal OUT, and the P-type MOS transistor MP21 has a source terminal connected to the power supply VDD. The capacitor C2 is connected between the output terminal OUT and the ground power supply.

Operation of the semiconductor integrated circuit of this embodiment thus configured will be described hereinafter.

Firstly, a case where a high level voltage is applied to the input terminal IN will be described. In this case, the N-type MOS transistor MN21 is turned on, and the P-type MOS transistors MP21 and MP22 are turned off, so that a low level voltage is output to the output terminal OUT. In this case, because the capacitor C2 is connected to the output terminal OUT, there is a delay in outputting a low level voltage to the output terminal OUT. The delay time is determined by the capacitance of the capacitor C2 (strictly speaking, the drain capacitances of the P-type MOS transistor MP22 and the N-type MOS transistor MN21, etc., are included) and the drive capability of the N-type MOS transistor MN21.

Conversely, when a low level voltage is applied to the input terminal IN, the N-type MOS transistor MN21 is turned off, and the P-type MOS transistors MP21 and MP22 are turned on, so that a high level voltage is output to the output terminal OUT. In this case, because the capacitor C2 is connected to the output terminal OUT, there is a delay in outputting the high level voltage to the output terminal OUT. The delay time is determined by the capacitance of the capacitor C2 and the overall drive capability of the P-type MOS transistors MP21 and MP22 connected together in series.

As used herein, the term "drive capability" with respect to a transistor refers to the absolute value of a saturated current of the transistor as described in the first embodiment.

As described above, the semiconductor integrated circuit of FIG. 6 is a delay device which outputs the inverted level of a signal input to the input terminal IN to the output terminal OUT after a delay time which is determined by the capacitance of the output terminal OUT and the drive capability of the MOS transistor corresponding to the level of the signal input to the input terminal IN. By providing a plurality of the circuits of FIG. 6 which are connected together in series, any delay time can be obtained. Of course, any delay time can also be obtained by changing the capacitance C2 of the capacitor and the drive capability of each transistor.

In the above description, it is clear that even if the gate terminal of one of the P-type MOS transistors MP21 and MP22 connected together in series is fixed to the low level, the same operation is achieved. It is also clear that even if the number of P-type MOS transistors connected together in series is increased, the same operation is achieved. Although the capacitor C2 is connected to the ground power supply in FIG. 6, it is clear that even if the capacitor C2 is connected to any fixed potential, the same operation is achieved.

In actual devices, there are variations in transistor characteristics, e.g., some transistors have a low drive capability, or conversely, some transistors have a high drive capability.

For example, in a finished product, operation in a case where a P-type MOS transistor has a low drive capability and an N-type MOS transistor has a high drive capability (condition 3) will be compared with operation in a case where a P-type MOS transistor has a low drive capability and an N-type MOS transistor also has a low drive capability (condition 4).

It is assumed that a signal which transitions from the low level to the high level is input to the input terminal IN.

The output terminal OUT transitions from the high level to the low level after a delay time which is determined by the capacitance of the output terminal OUT and the drive capability of the N-type MOS transistor MN21.

Under the condition 3, the N-type MOS transistor MN21 which transitions from the off state to the on state has a high drive capability, and therefore, the delay time is short. In contrast to this, under the condition 4, the N-type MOS transistor MN21 which transitions from the off state to the on state has a low drive capability, and therefore, the delay time is long.

When a signal which transitions from the high level to the low level is input to the input terminal IN, there is not a difference in delay time between the conditions 3 and 4. This is because, although the delay time depends on the overall drive capability of the P-type MOS transistors MP21 and MP22 which transition from the off state to the on state, there is not a difference in the overall drive capability of the P-type MOS transistors MP21 and MP22 between the conditions 3 and 4.

In other words, under the conditions 1 and 2 of the finished transistors, a difference in the delay time of the delay circuit occurs only due to a change in characteristics of the N-type MOS transistor.

Thus, there is not a difference in the overall drive capability of the P-type MOS transistors between the conditions 3 and 4. Therefore, in order to reduce the difference in the delay time of the delay circuit between the conditions 3 and 4, the drive capability of the N-type MOS transistor may be previously set to be higher than the overall drive capability of the P-type MOS transistors.

In the configuration of FIG. 6, the two P-type MOS transistors are connected together in series. If the P-type MOS transistors MP21 and MP22 have the same drive capability, the overall drive capability of the P-type MOS transistors MP21 and MP22 provided between the power supply VDD and the output terminal OUT has half the drive capability of one P-type MOS transistor. Alternatively, if a plurality of P-type MOS transistors having the same drive capability are connected together in series, the overall drive capability of the P-type MOS transistors provided between the power supply VDD and the output terminal OUT has a value which is obtained by dividing the drive capability of one P-type MOS transistor by the number of the P-type MOS transistors connected together in series.

The present inventor has studied characteristics of actual delay circuits under the conditions 3 and 4, under the same temperature and voltage conditions, based on the theory that if a P-type MOS transistor and an N-type MOS transistor have the same channel width and the same channel length, the drive capability of the P-type MOS transistor is about twice as high as the drive capability of the N-type MOS transistor. As a result, it was found that if the overall drive capability of the P-type MOS transistors is equal to the drive capability of the N-type MOS transistor, the ratio of the delay time of the delay circuit under the condition 3 to the delay time of the delay circuit under the condition 4 is 70%. If the over drive capability of the P-type MOS transistors is twice or more as high as the drive capability of the N-type MOS transistor, the ratio of the delay time of the delay circuit under the condition 3 to the delay time of the delay circuit under the condition 4 is improved to 80% or more. Note that as the ratio of the delay time of the delay circuit under the condition 3 to the delay time of the delay circuit under the condition 4 is closer to 100%, the difference in the delay time of the delay circuit between the conditions 3 and 4 is further reduced.

As described above, if the drive capability of the N-type MOS transistor is twice or more as high as the overall drive capability of the P-type MOS transistors, fluctuations in the delay time of the delay circuit caused by variations in transistor characteristic can be reduced.

A relationship between the over drive capability of the P-type MOS transistors and the drive capability of the N-type MOS transistor is represented using the channel width and channel length of the transistors as follows. Here, it is assumed that the drive capability of the N-type MOS transistor is about twice as high as the drive capability of each P-type MOS transistor, and all the P-type MOS transistors connected together in series have the same size.

Firstly, it is assumed that all the transistors have the same channel length. In this case, the channel width of the N-type MOS transistor may be set to be larger than or equal to a value which is obtained by dividing the channel width of one P-type MOS transistor by the number of the P-type MOS transistors connected together in series.

Next, it is assumed that all the transistors have the same channel width. In this case, the channel length of the N-type MOS transistor may be set to be smaller than or equal to a value which is obtained by multiplying the channel length of one P-type MOS transistor by the number of the P-type MOS transistors connected together in series.

Seventh Embodiment

Figure 7:
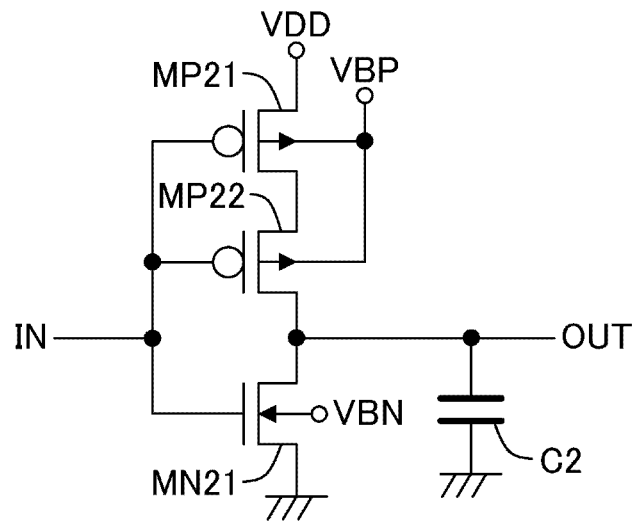
FIG. 7 is a circuit diagram showing a configuration of a semiconductor integrated circuit according to a seventh embodiment of the present disclosure.

FIG. 7 is a diagram showing a configuration of a semiconductor integrated circuit according to a seventh embodiment of the present disclosure.

The configuration of FIG. 7 is similar to that of FIG. 6, except that a substrate node of the N-type MOS transistor MN21 is connected to a substrate potential VBN, and substrate nodes of the P-type MOS transistors MP21 and MP22 are connected to a substrate potential VBP.

The drive capability of a MOS transistor can be changed by changing the substrate potential of the MOS transistor.

Typically, if a potential which is higher than a power supply VDD at the source terminal is applied to a P-type MOS transistor (backward bias), the drive capability of the P-type MOS transistor decreases. If a potential which is higher than a ground power supply at the source terminal is applied to an N-type MOS transistor (forward bias), the drive capability of the N-type MOS transistor increases.

In other words, if a potential which is higher than the ground power supply is applied to the substrate node VBN of the N-type MOS transistor MN21, or a potential which is higher than the power supply VDD is applied to the substrate node VBP of the P-type MOS transistors MP21 and MP22, the aforementioned drive capability ratio can be achieved by using transistors having a smaller size than that of the transistors of FIG. 6. As a result, a circuit having a smaller area can be obtained.

Although two P-type MOS transistors are connected together in series in the configuration of FIG. 7, it is clear that even if a plurality of P-type MOS transistors are connected together in series, the same operation and advantages can be achieved. Moreover, it is not necessary to control the substrate potentials of all the P-type MOS transistors. It is clear that similar advantages can be achieved even if the substrate potentials of only some of the P-type MOS transistors are controlled.

Eighth Embodiment

Figure 8:
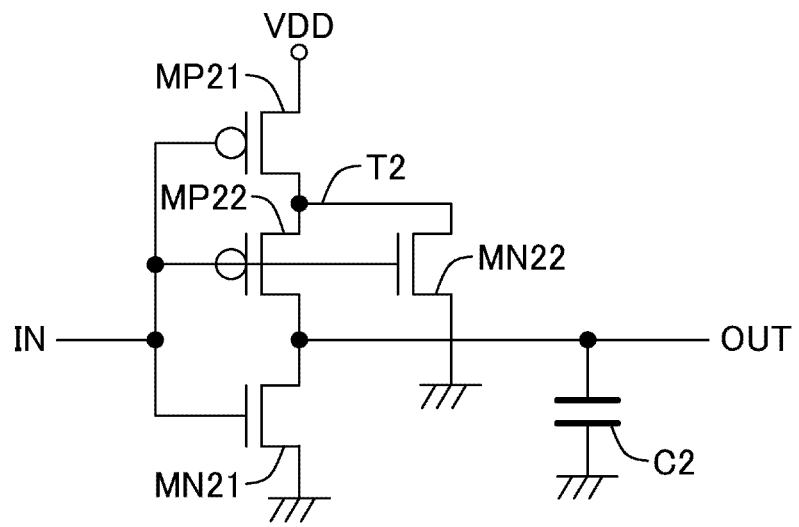
FIG. 8 is a circuit diagram showing a configuration of a semiconductor integrated circuit according to an eighth embodiment of the present disclosure.

FIG. 8 is a diagram showing a configuration of a semiconductor integrated circuit according to an eighth embodiment of the present disclosure.

The configuration of FIG. 8 is similar to that of FIG. 6, except that an N-type MOS transistor MN22 having a gate terminal connected to the input terminal IN is further provided between a connection node T2 between the P-type MOS transistors MP21 and MP22 connected together in series and the ground power supply.

Operation of the semiconductor integrated circuit of this embodiment will be described.

Firstly, when the high level voltage is applied to the input terminal IN, the N-type MOS transistor MN22 is turned on, so that the connection node T2 between the P-type MOS transistors MP21 and MP22 transitions to the low level. In this case, because the P-type MOS transistors MP21 and MP22 are off, the configuration of FIG. 8 performs the same operation as that of the configuration of FIG. 6.

Next, when the low level voltage is applied the input terminal IN, the N-type MOS transistor MN22 is turned off, so that the P-type MOS transistors MP21 and Mp22 are not affected. In this case, therefore, the configuration of FIG. 8 performs the same operation as that of the configuration of FIG. 6.

As described above, the configuration of FIG. 8 performs the same operation as that of the configuration of FIG. 6.

In the configuration of FIG. 6, when the input terminal IN is at the high level, the potential of the connection node T2 between the P-type MOS transistors MP21 and MP22 has an indefinite level because both the P-type MOS transistors MP21 and MP22 are turned off. Therefore, when the input terminal IN transitions from the high level to the low level, so that the P-type MOS transistors MP21 and MP22 transition from the off state to the on state, fluctuations in the delay time occurs due to the potential state of the connection node T2.

Therefore, as shown in FIG. 8, if the N-type MOS transistor MN22 having a gate terminal connected to the input terminal IN is further provided between the connection node T2 between the P-type MOS transistors MP21 and MP22 connected together in series and the ground power supply, the connection node T2 is invariably at the low level during the period of time that the P-type MOS transistors MP21 and MP22 are off, whereby the delay time can be caused to be more stable.

In the configuration of FIG. 8, two P-type MOS transistors are connected together in series. It is clear that even if a plurality of P-type MOS transistors are connected together in series, and an N-type MOS transistor having a gate terminal connected to the input terminal IN is provided between a connection node between each P-type MOS transistor and the ground power supply, the same operation and advantages can be achieved.

Moreover, it is clear that even if the substrate node control described in the seventh embodiment is applied to this embodiment, advantages similar to those of the seventh embodiment are achieved.

Ninth Embodiment

Figure 9:
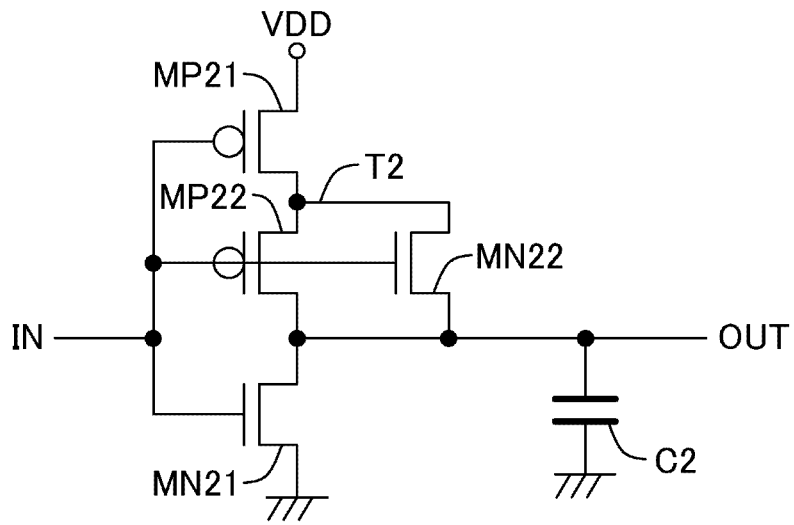
FIG. 9 is a circuit diagram showing a configuration of a semiconductor integrated circuit according to a ninth embodiment of the present disclosure.

FIG. 9 is a diagram showing a configuration of a semiconductor integrated circuit according to a ninth embodiment of the present disclosure.

The configuration of FIG. 9 is similar to that of FIG. 8, except that the source terminal of the N-type MOS transistor MN22 is connected to the output terminal OUT instead of the ground power supply.

Operation of the semiconductor integrated circuit of this embodiment will be described.

Firstly, when the high level voltage is input to the input terminal IN, the N-type MOS transistor MN22 is turned on, so that the connection node T2 between the P-type MOS transistors MP21 and MP22 transitions to the low level. In this case, because the P-type MOS transistors MP21 and MP22 are turned off, the configuration of FIG. 9 performs operation similar to that of the configuration of FIG. 6.

Next, when the low level voltage is input to the input terminal IN, the N-type MOS transistor MN22 is turned off. In this case, the P-type MOS transistors MP21 and MP22 are not affected, and therefore, the configuration of FIG. 9 performs operation similar to that of the configuration of FIG. 6.

As described above, the configuration of FIG. 9 performs operation similar to that of the configuration of FIG. 6.

In the configuration of FIG. 6, when the input terminal IN is at the high level, the potential of the connection node T2 between the P-type MOS transistors MP21 and MP22 has an indefinite level because both the P-type MOS transistors MP21 and MP22 are off. Therefore, when the input terminal IN transitions from the high level to the low level, so that the P-type MOS transistors MP21 and MP22 transition from the off state to the on state, fluctuations in the delay time occur due to the potential state of the connection node T2.

Therefore, as shown in FIG. 9, if the N-type MOS transistor MN22 having a gate terminal connected to the input terminal IN is further provided between the connection node T2 between the P-type MOS transistors MP21 and MP22 connected together in series and the output terminal OUT, the connection node T2 is invariably at the low level during the period of time that the P-type MOS transistors MP21 and MP22 are off, whereby the delay time can be caused to be more stable.

Moreover, the N-type MOS transistor MN22 serves as an additional capacitor for the output terminal OUT. Therefore, the capacitance value of the capacitor C2 can be reduced in an amount corresponding to a capacitance value added by the N-type MOS transistor MN22, resulting in a reduction in area.

In the configuration of FIG. 9, two P-type MOS transistors are connected together in series. It is clear that even if a plurality of P-type MOS transistors are connected together in series, and an N-type MOS transistor having a gate terminal connected to the input terminal IN is further provided between a connection node between each P-type MOS transistor and the output terminal OUT, the same operation and advantages can be achieved.

Moreover, it is clear that even if the substrate node control described in the seventh embodiment is applied to this embodiment, advantages similar to those of the seventh embodiment are achieved.

Tenth Embodiment

Figure 10:
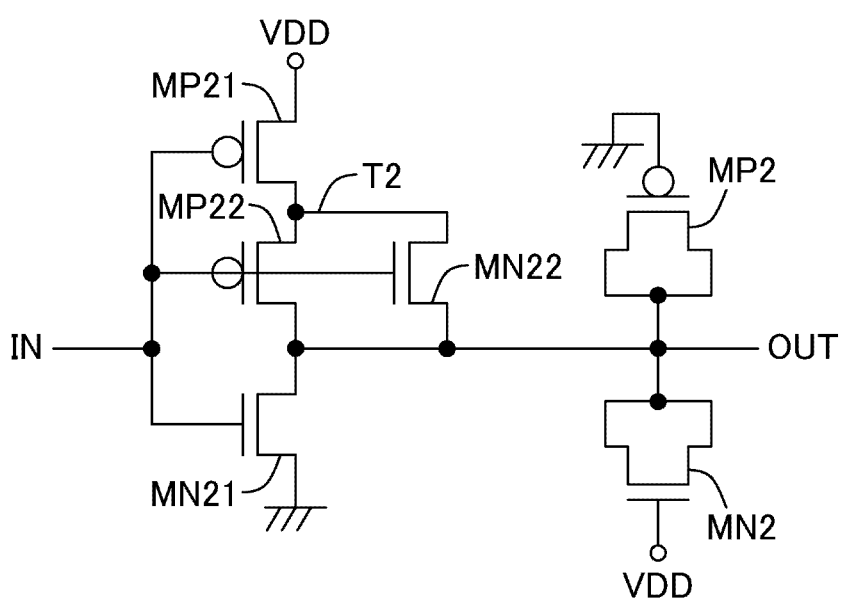
FIG. 10 is a circuit diagram showing a configuration of a semiconductor integrated circuit according to a tenth embodiment of the present disclosure.

FIG. 10 is a diagram showing a configuration of a semiconductor integrated circuit according to a tenth embodiment of the present disclosure.

The configuration of FIG. 10 is similar to that of FIG. 9, except that the capacitor C2 is replaced with a P-type MOS transistor MP2 and an N-type MOS transistor MN2 which serve as a capacitor.

The P-type MOS transistor MP2 has a gate terminal connected to the ground power supply, and a source terminal and a drain terminal connected to the output terminal OUT. The N-type MOS transistor MN2 has a gate terminal connected to the power supply VDD, and a source terminal and a drain terminal connected to the output terminal OUT.

Firstly, the semiconductor integrated circuit of this embodiment has a configuration similar to that of FIG. 9, only except that the capacitor C2 of FIG. 9 is replaced with transistors serving as a capacitor, and therefore, it is clear that the same operation and advantages as those of the ninth embodiment are achieved.

As also described in the sixth embodiment, in actual devices, there are variations in transistor characteristics, e.g., some transistors have a low drive capability, or conversely, some transistors have a high drive capability.

Typically, the drive capability of a transistor depends on the finished channel length of the transistor. If the finished channel length of the transistor is small, the drive capability of the transistor is high. Conversely, if the finished channel length of the transistor is large, the drive capability of the transistor is low.

Therefore, in a finished product, if a P-type MOS transistor has a low drive capability and an N-type MOS transistor has a high drive capability (condition 3) and if a P-type MOS transistor has a low drive capability and an N-type MOS transistor also has a low drive capability (condition 4), there is not a change in the finished channel length of the P-type MOS transistor, but there is a significant change in the finished channel length of the N-type MOS transistor.

When a P-type MOS transistor and an N-type MOS transistor which serve as a capacitor are provided as in this embodiment, the capacitance of the P-type MOS transistor serving as a capacitor may be set to be larger than the capacitance of the N-type MOS transistor serving as a capacitor. Alternatively, only the P-type MOS transistor may be provided to serve as a capacitor.

As a result, fluctuations in the delay time of the delay circuit caused by variations in the capacitance value of the capacitor can be reduced.

Typically, a capacitor constructed by a MOS transistor as shown in FIG. 10 has a capacitance value which is proportional to the product of the channel length and channel width of the transistor. Here, if it is assumed that the P-type MOS transistor serving as a capacitor and the N-type MOS transistor serving as a capacitor have the same channel length and the same channel width, and therefore, the P-type MOS transistor serving as a capacitor and the N-type MOS transistor serving as a capacitor have substantially the same capacitance value, the product of the channel length and channel width of the P-type MOS transistor serving as a capacitor may be set to be larger than the product of the channel length and channel width of the N-type MOS transistor serving as a capacitor.

Eleventh Embodiment

An example in which the delay device (delay circuit) of the present disclosure is used as a delay circuit for a semiconductor storage device, such as a static random access memory (hereinafter referred to as an SRAM) etc.

Figure 11:
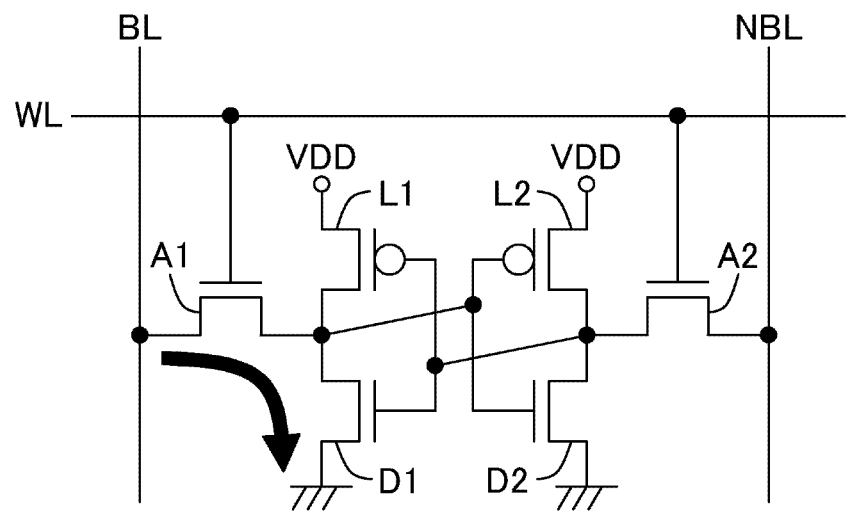
FIG. 11 is a circuit diagram showing a specific configuration of an SRAM memory cell.

FIG. 11 is a diagram showing a circuit configuration of a memory cell of an SRAM.

The SRAM memory cell of FIG. 11 includes access transistors A1 and A2, drive transistors D1 and D2, and load transistors L1 and L2. A reference character WL indicates a word line, reference characters BL and NBL indicate bit lines, and VDD indicates a power supply.

The load transistor L1 (L2) and the drive transistor D1 (D2) form an inverter between the power supply VDD and a ground power supply. An output terminal of each inverter is connected to an input terminal of the other inverter to form a flip-flop. The flip-flop is used to store and hold data. The access transistor A1 (A2) has a gate terminal connected to the word line WL, a drain terminal connected to the bit line BL (NBL), and a source terminal connected to the input/output terminals of the inverters.

Example operation of the SRAM memory cell will be briefly described hereinafter.

For example, it is assumed that the source terminal of the access transistor A1 of the memory cell is held at the low level while the source terminal of the access transistor A2 of the memory cell is held at the high level.

When the word line WL is at the low level, both of the bit lines BL and NBL are precharged to the high level. When the precharge states of the bit lines BL and NBL are canceled, so that the word line WL transitions to the high level, the potential of the bit line BL transitions from the high level to the low level while the accumulated charge of the bit line BL is discharged to the ground power supply via the on-state access transistor A1 and drive transistor D1. The transition speed of the bit line BL is determined by the performance of the access transistor A1 and the drive transistor D1. In this case, because the source terminal of the access transistor A2 is at the high level, the bit line NBL is not affected and is kept precharged at the high level.

The potential difference between the bit lines BL and NBL caused by the above operation is amplified by a sense amplifier, whereby data is read from the memory cell.

As described above, data is read from the memory cell via only the access transistor and the drive transistor included in the memory cell. Both the access and drive transistors include an N-type MOS transistor. Also, the access and drive transistors are connected together in series.

Therefore, when the delay circuit of the present disclosure is used to generate a timing signal for activating the sense amplifier in read operation of a semiconductor storage device, such as an SRAM etc., then if the delay circuit which determines the delay time is configured to have the same transistor polarity as that of the access and drive transistors which determine the read speed (corresponding to the N-type MOS transistors MN11 and MN12 connected together in series in the configurations of the first to fifth embodiments), the ability of the delay circuit to cause the delay time to follow a memory cell characteristic (read speed) can be improved.

Moreover, when the delay circuit which determines the delay time is configured to correspond to the number of the access and drive transistors connected together in series which determine a memory cell characteristic (read speed) (corresponding to the N-type MOS transistors MN11 and MN12 connected together in series in the first to fifth embodiments), the ability of the delay circuit to cause the delay time to follow a memory cell characteristic (read speed) can be improved.

In this embodiment, a memory cell characteristic is determined by two transistors connected together in series. Alternatively, it is clear that if a memory cell characteristic is determined by transistors connected together in series the number of which is not two, the number of transistors connected together in series in the delay circuit may be set to be equal to the number of transistors which determine the memory cell characteristic.

Typically, in an SRAM memory cell, the conductance of the access transistor is set to be lower than the conductance of the drive transistor, and therefore, the speed at which the accumulated charge of a bit line is discharged to a ground power supply is substantially determined by the performance of the access transistor. Therefore, even if the delay circuit includes a transistor having the same transistor polarity as that of at least the access transistor connected to a bit line, the ability of the delay circuit to cause the delay time to follow a memory cell characteristic can be improved.

Typically, transistors included in SRAM memory cells are formed by implantation at an impurity concentration which is different from that of transistors other than those in SRAM memory cells. Therefore, if N-type MOS transistors which determine the delay time of the delay circuit (corresponding to the N-type MOS transistors MN11 and MN12 connected together in series in the first to fifth embodiments) are formed by implantation at the same impurity concentration as that of SRAM memory cells, the ability of the delay circuit to cause the delay time to follow a memory cell characteristic (read speed) can be improved.

In this embodiment, a method for improving the ability of the delay circuit to cause the delay time to follow a memory cell characteristic which is determined by N-type MOS transistors has been described. This method is effective to the configurations of the first to fifth embodiments. Conversely, it is clear that when a memory cell characteristic is determined by P-type MOS transistors, then if the configurations of the sixth to tenth embodiments are applied, the same advantages can be obtained.

Twelfth Embodiment

Figure 12:
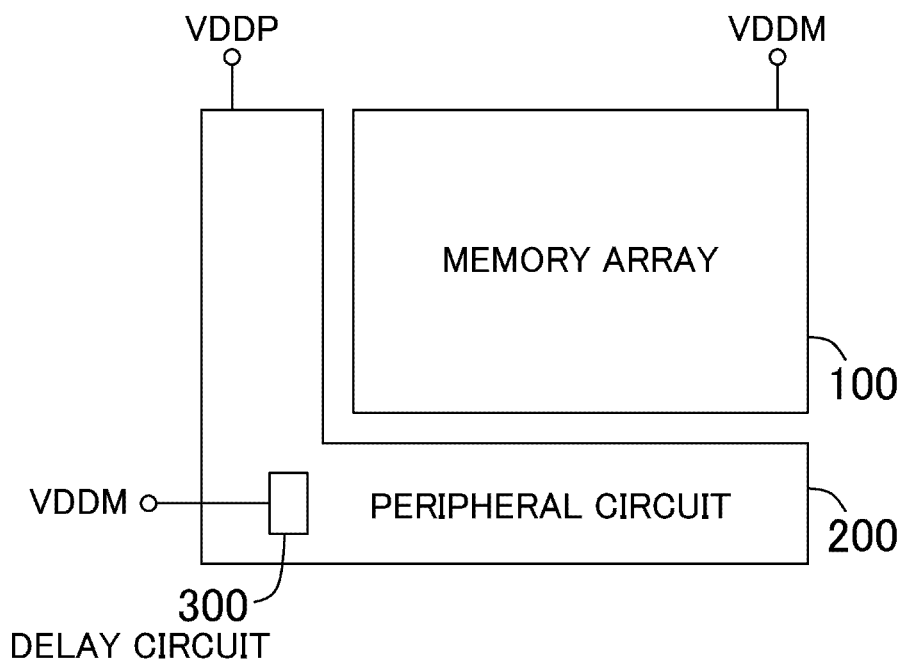
FIG. 12 is a circuit diagram showing a configuration of a semiconductor integrated circuit according to a twelfth embodiment of the present disclosure.

FIG. 12 is a diagram showing an example configuration of a semiconductor storage device, such as an SRAM etc.

The semiconductor storage device of FIG. 12 includes a memory array 100, a peripheral circuit 200, and a delay circuit 300. A reference character VDDP indicates a power supply for a peripheral circuit, and a reference character VDDM indicates a power supply for a memory array.

The memory array 100 includes, for example, a plurality of the SRAM memory cells of FIG. 11 arranged in a matrix. The power supply VDD of FIG. 11 is replaced with the memory array power supply VDDM. The peripheral circuit 200 is a control circuit which controls the memory array 100, and is driven by the peripheral circuit power supply VDDP. The delay circuit 300 is, for example, used to generate a timing signal for activating a sense amplifier as in the eleventh embodiment.

Figure 13:
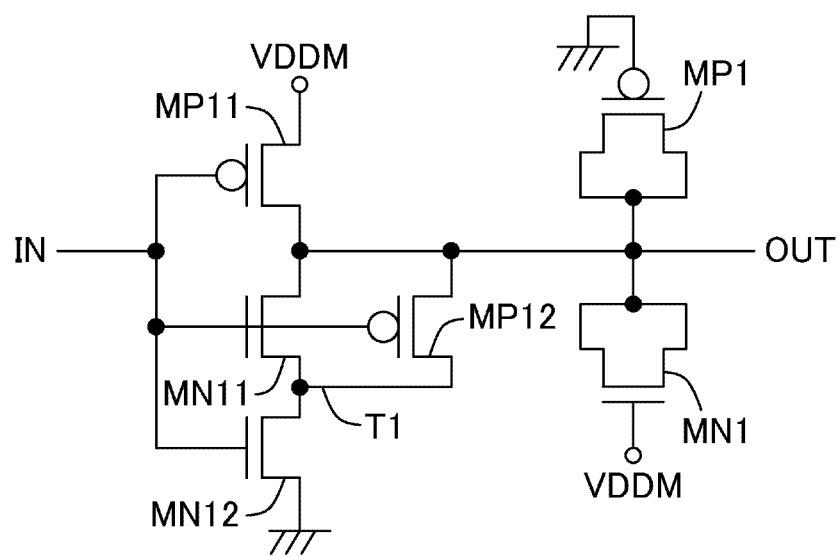
FIG. 13 is a circuit diagram showing an example specific configuration of a delay circuit according to the twelfth embodiment.

FIG. 13 shows an example delay circuit included in the delay circuit 300. The configuration of FIG. 13 is similar to that of FIG. 5, except that all the power supplies VDD are replaced with the memory array power supply VDDM. Therefore, operation and advantages etc. similar to those of the fifth embodiment are achieved.

As in the configuration of FIG. 12, in a semiconductor storage device in which the power supply VDDM for a memory array (memory cells) is different from the power supply VDDP for controlling a peripheral circuit, a memory cell characteristic is determined by the memory array power supply VDDM. Therefore, if the memory array power supply VDDM of FIG. 13 is used as a power supply for the delay circuit 300, the ability of the delay circuit to cause the delay time to follow a memory cell characteristic can be improved.

Thirteenth Embodiment

Figure 14:
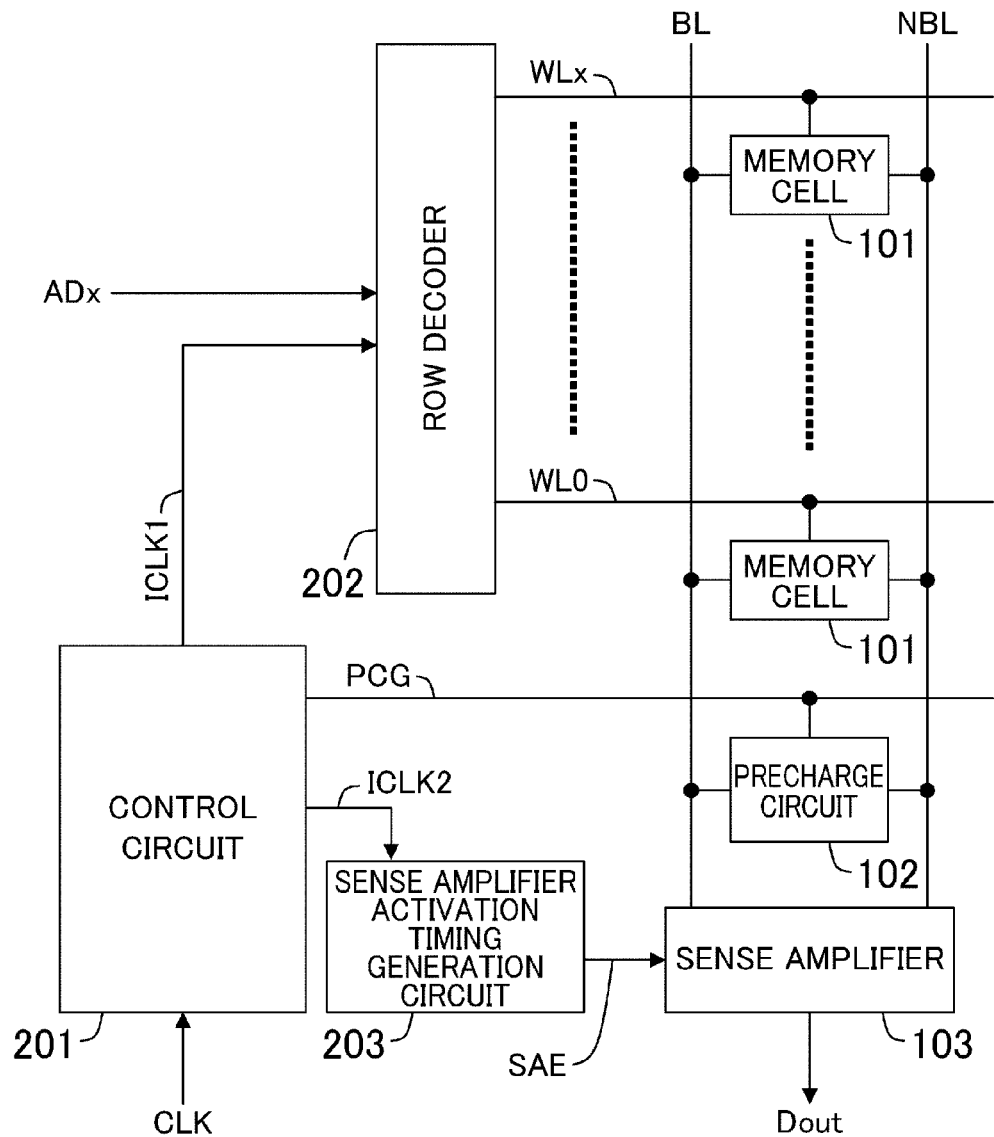
FIG. 14 is a circuit diagram showing an example specific configuration of a semiconductor storage circuit according to a thirteenth embodiment of the present disclosure.

FIG. 14 is a diagram showing an example specific configuration of a semiconductor storage device, such as an SRAM etc.

The semiconductor storage device of FIG. 14 includes memory cells 101, a precharge circuit 102, a sense amplifier 103, a control circuit 201, a row decoder 202, and a sense amplifier activation timing generation circuit 203. Reference characters WL0 and WLx indicate word lines, reference characters BL and NBL indicate bit lines, a reference character PCG indicates a precharge control signal, reference characters ICLK1 and ICLK2 indicate internal clock signals, a reference character CLK indicates a clock, a reference character ADx indicates an address, a reference character Dout indicates a data output, and a reference character SAE indicates a sense amplifier enable signal. For the sake of simplicity, FIG. 14 does not show write circuitry.

The memory cells 101 are connected to the word lines WL0-WLx and the bit lines BL and NBL. When any word line transitions to the high level (active state), data stored and held by a memory cell 101 connected to the high-level word line is output to the bit lines BL and NBL. A word line which is at the low level (inactive state) does not have an influence on the bit lines BL and NBL. The memory cells 101 have the specific circuit configuration of FIG. 11.

The precharge circuit 102 is connected to a precharge signal PCG and the bit lines BL and NBL. When the precharge signal PCG is at the low level, the precharge circuit 102 is in the active state and precharges the bit lines BL and NBL to the high level. When the precharge signal PCG is at the high level, the precharge circuit 102 is in the inactive state and does not have an influence on the bit lines BL and NBL.

The sense amplifier 103 is connected to the bit lines BL and NBL and is controlled based on the sense amplifier enable signal SAE output from the sense amplifier activation timing generation circuit 203. When the sense amplifier enable signal SAE is at the high level, the sense amplifier 103 is in the active state and outputs the result of amplification of the bit lines BL and NBL to the data output Dout.

The control circuit 201 receives a clock CLK, generates internal clocks ICKL1 and ICLK2 and the precharge signal PCG which are synchronous with the clock CLK, and outputs the internal clocks ICLK1 and ICLK2 and the precharge signal PCG to the row decoder 202, the sense amplifier activation timing generation circuit 203, and the precharge circuit 102, respectively. For example, when the clock CLK transitions from the low level to the high level, the internal clocks ICKL1 and ICLK2 and the precharge signal PCG each transition from the low level to the high level. When the clock CLK transitions from the high level to the low level, the internal clocks ICKL1 and ICLK2 and the precharge signal PCG each transition from the high level to the low level.

The row decoder 202, when the internal clock ICKL1 is at the high level, selects any of the word lines WL0-WLx (a selected word line transitions to the high level) based on the input address ADx. When the internal clock ICKL1 is at the low level, all the word lines WL0-WLx are at the low level.

The sense amplifier activation timing generation circuit 203, when the internal clock ICLK2 transitions to the high level, outputs the sense amplifier enable signal SAE (the high level) for activating the sense amplifier 103 after a predetermined period of time elapses. Note that, after the output of the sense amplifier enable signal SAE (the high level), the internal clocks ICKL1 and ICLK2 and the precharge signal PCG of the control circuit 201 may each be controlled to the low level.

The internal clock ICLK2 may be the internal clock ICKL1. Alternatively, the internal clock ICLK2 may be a signal which is based on the result that any word line transitions to the high level.

Example operation of the semiconductor storage device thus configured will be described hereinafter.

When the clock CLK is at the low level, all the word lines are at the low level (inactive state). In this case, the precharge signal PCG is at the low level, and therefore, the precharge circuit 102 is in the active state and precharges the bit lines BL and NBL to the high level.

When the clock CLK transitions to the high level, the internal clock ICKL1 transitions to the high level, so that a word line WLx selected based on the address ADx transitions to the high level. In this case, the precharge signal PCG transitions to the high level, so that the precharge circuit 102 transitions to the inactive state. The internal clock ICLK2 also transitions to the high level.

A memory cell 101 connected to the selected word line WLx causes one of the bit lines BL and NBL precharged to the high level to transition from the high level to the low level, depending on data stored and held in the memory cell 101, whereby data is read from the memory cell 101.

At the same time, the sense amplifier activation timing generation circuit 203 which has received the high-level internal clock ICLK2 causes the sense amplifier enable signal SAE to transition from the low level to the high level after a predetermined period of time elapses, thereby causing the sense amplifier 103 to transition to the active state. The activated sense amplifier 103 amplifies the potential difference between the bit lines BL and NBL, and outputs the result of the amplification to the data output Dout.

In a semiconductor storage device, when a potential difference read from a memory cell to bit lines is amplified by a sense amplifier, the sense amplifier is activated when the potential difference reaches a value which can be normally amplified by the sense amplifier. The delay circuit of the present disclosure is used to generate a timing signal for activating the sense amplifier. In this embodiment, the delay circuit of the present disclosure is used as the sense amplifier activation timing generation circuit 203.

It is assumed that a conventional delay circuit (Japanese Patent Publication No. 2003-218239) is used as the sense amplifier activation timing generation circuit 203. In this case, the delay time is determined by characteristics of both the N-type MOS transistor and the P-type MOS transistor. For a finished product, there are two conditions: the N-type MOS transistor has a low drive capability and the P-type MOS transistor has a high drive capability (condition 1); and the N-type MOS transistor has a low drive capability and the P-type MOS transistor also has a low drive capability (condition 2). The activation timing of the sense amplifier is later under the condition 2 than under the condition 1.

In contrast to this, the speed at which data is read from a memory cell is determined by only the N-type MOS transistors (the access and drive transistors) as shown in FIG. 11, and is not affected by the characteristics of the P-type MOS transistor. In other words, the speed at which data is read from a memory cell does not change regardless of whether the condition 1 or the condition 2 is satisfied.

Therefore, the timing of activation of the sense amplifier is invariably designed based on the condition 1.

However, the access time of a semiconductor storage device is determined by the condition 2 under which the delay time of the delay circuit is longest. Therefore, if there is a large difference in the delay time of the delay circuit between the conditions 1 and 2 as in conventional delay circuits (Japanese Patent Publication No. 2003-218239), the access time is disadvantageously increased.

Therefore, if the delay circuit of the present disclosure is used as the sense amplifier activation timing generation circuit 203, fluctuations in the delay time of the delay circuit between the conditions 1 and 2 can be reduced, whereby the increase in the access time of a semiconductor storage device can be minimized.

Fourteenth Embodiment

Figure 15:
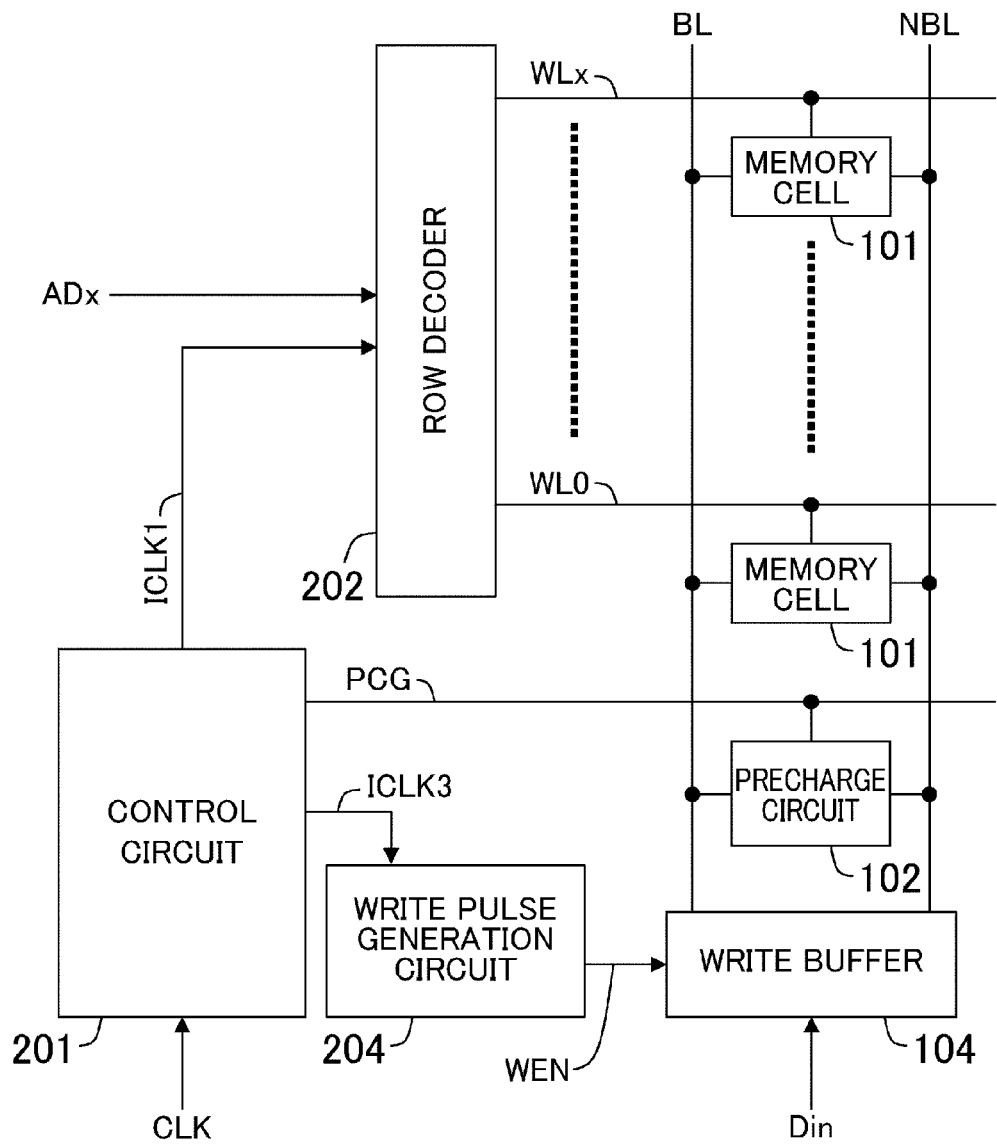
FIG. 15 is a circuit diagram showing an example specific configuration of a semiconductor storage circuit according to a fourteenth embodiment of the present disclosure.

FIG. 15 is a diagram showing another example specific configuration of a semiconductor storage device, such as an SRAM etc.

The semiconductor storage device of FIG. 15 includes memory cells 101, a precharge circuit 102, a write buffer 104, a control circuit 201, a row decoder 202, and a write pulse generation circuit 204. Reference characters WL0 and WLx indicate word lines, reference characters BL and NBL indicate bit lines, a reference character PCG indicates a precharge control signal, reference characters ICLK1 and ICLK3 indicate internal clock signals, a reference character CLK indicates a clock, a reference character ADx indicates an address, a reference character Din indicates a data input, and a reference character WEN indicates a write enable signal. For the sake of simplicity, FIG. 15 does not show read circuitry.

The memory cells 101 are connected to the word lines WL0-WLx and the bit lines BL and NBL. When any word line transitions to the high level (active state), data is written from the bit lines BL and NBL to a memory cell 101 connected to the high-level word line. A word line which is at the low level (inactive state) does not have an influence on the bit lines BL and NBL. The memory cells 101 have the specific circuit configuration of FIG. 11.

Data is written to a memory cell 101 by causing one of the bit lines BL and NBL precharged to the high level to transition from the high level to the low level while a corresponding word line is at the high level. For example, when low level data is written to a memory cell 101, the bit line BL is caused to transition to the low level. Conversely, when high level data is written to a memory cell 101, the bit line NBL is caused to transition to the low level.

The precharge circuit 102 is connected to the precharge signal PCG and the bit lines BL and NBL. When the precharge signal PCG is at the low level, the precharge circuit 102 is in the active state and precharges the bit lines BL and NBL to the high level. When the precharge signal PCG is at the high level, the precharge circuit 102 is in the inactive state and does not have an influence on the bit lines BL and NBL.

The write buffer 104 is connected to the bit lines BL and NBL and is controlled based on the write enable signal WEN output from the write pulse generation circuit 204 to output data input from the data input Din to the bit lines BL and NBL, so that the data is written to a memory cell 101.

The control circuit 201 receives the clock CLK, generates the internal clocks ICKL1 and ICLK3 and the precharge signal PCG which are synchronous with the clock CLK, and outputs the internal clocks ICLK1 and ICLK3 and the precharge signal PCG to the row decoder 202, the write pulse generation circuit 204, and the precharge circuit 102, respectively. For example, when the clock CLK transitions from the low level to the high level, the internal clocks ICKL1 and ICLK3 and the precharge signal PCG each transition from the low level to the high level. When the clock CLK transitions from the high level to the low level, the internal clocks ICKL1 and ICLK3 and the precharge signal PCG transition from the high level to the low level.

The row decoder 202, when the internal clock ICKL1 is at the high level, selects any of the word lines WL0-WLx (a selected word line transitions to the high level) based on the input address ADx. When the internal clock ICKL1 is at the low level, all the word lines WL0-WLx are at the low level.

The write pulse generation circuit 204, when the internal clock ICLK3 transitions to the high level, causes the write enable signal WEN for activating the write buffer 104 to transition to the high level, and causes the write enable signal WEN to transition to the low level after a predetermined period of time elapses (after data is written to a memory cell 101), thereby causing the write buffer 104 to transition to the inactive state. Note that after the write enable signal WEN transitions from the high level to the low level, the internal clocks ICKL1 and ICLK3 and the precharge signal PCG of the control circuit 201 may be controlled to the low level.

The internal clock ICLK3 may be the internal clock ICKL1. Alternatively, the internal clock ICLK3 may be a signal which is based on the result that any word line transitions to the high level.

Example operation of the semiconductor storage device thus configured will be described hereinafter.

When the clock CLK is at the low level, all the word lines are at the low level (inactive state). In this case, the precharge signal PCG is at the low level, so that the precharge circuit 102 transitions to the active state, and precharges the bit lines BL and NBL to the high level.

When the clock CLK transitions to the high level, the internal clock ICKL1 transitions to the high level, a word line WLx selected based on the address ADx transitions to the high level. In this case, the precharge signal PCG transitions to the high level, so that the precharge circuit 102 transitions to the inactive state. The internal clock ICLK3 also transitions to the high level.

The write pulse generation circuit 204 which has received the high-level internal clock ICLK3 causes the write enable signal WEN to transition from the low level to the high level, which activates the write buffer 104. The activated write buffer 104 causes one of the bit lines BL and NBL to transition from the high level to the low level based on data input from the data input Din, so that the data is written to a memory cell 101 connected to the selected word line WLx.

After a predetermined period of time has elapsed (after data has been written to a memory cell 101), the write enable signal WEN transitions from the high level to the low level, which inactivates the write buffer 104.

When the write buffer 104 transitions to the inactive state, the word line WLx may be caused to transition to the low level, and the precharge circuit 102 may be activated to precharge the bit lines BL and NBL to the high level again.

In semiconductor storage devices, when data is written to a memory cell, a write buffer is kept in the active state for a sufficient period of time to reliably complete the write operation of the memory cell. The delay circuit of the present disclosure is used to generate a timing signal for keeping the write buffer in the active state. In this embodiment, the delay circuit of the present disclosure is used as the write pulse generation circuit 204.

It is assumed that a conventional delay circuit (Japanese Patent Publication No. 2003-218239) is used as the write pulse generation circuit 204. In this case, the delay time is determined by characteristics of both the N-type MOS transistor and the P-type MOS transistor. For a finished product, there are two conditions: the N-type MOS transistor has a low drive capability and the P-type MOS transistor has a high drive capability (condition 1); and the N-type MOS transistor has a low drive capability and the P-type MOS transistor also has a low drive capability (condition 2). The period of time during which the write enable signal WEN is at the high level is longer under the condition 2 than under the condition 1, and therefore, the period of time during which the write buffer 104 is in the active state is longer under the condition 2 than under the condition 1.

Typically, a period of time required to write data to a memory cell is longer under the condition 1 than under the condition 2. This is because of an influence of a load transistor (L1 or L2 in FIG. 11) included in a memory cell. If the performance of the load transistor which is a P-type MOS transistor is high, it is difficult to write data, and if the performance of the load transistor is low, it is easy to write data.

Therefore, the period of time during which the write enable signal WEN generated by the write pulse generation circuit 204 is at the high level (the period of time during which the write buffer 104 is in the active state) is invariably designed based on the condition 1.

However, the cycle time of a semiconductor storage device is determined by the condition 2 under which the period of time during which the write enable signal WEN is at the high level is longest. Therefore, if there is a large difference in the delay time of the delay circuit between the conditions 1 and 2 as in conventional delay circuits (Japanese Patent Publication No. 2003-218239), the cycle time is disadvantageously increased.

Therefore, if the delay circuit of the present disclosure is used as the write pulse generation circuit 204, fluctuations in the delay time of the delay circuit between the conditions 1 and 2 can be reduced, whereby the increase in the cycle time of a semiconductor storage device can be minimized.

Fifteenth Embodiment

Figure 16:
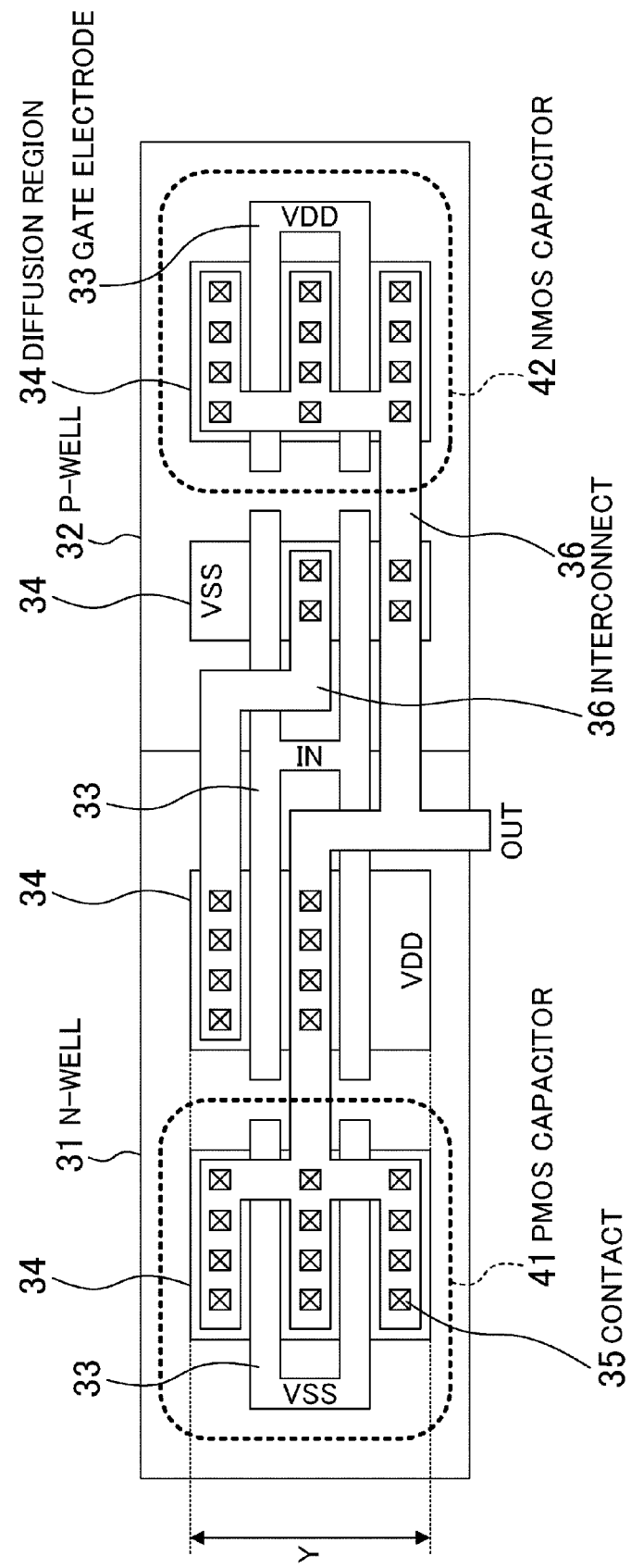
FIG. 16 is a diagram showing an example layout configuration of a semiconductor integrated circuit according to a fifteenth embodiment of the present disclosure.

FIG. 16 is a diagram showing an example layout configuration of a semiconductor integrated circuit according to a fifteenth embodiment of the present disclosure.

The semiconductor integrated circuit of FIG. 16 includes an N-well 31, a P-well 32, gate electrodes 33, diffusion regions 34, contacts 35, interconnects 36, a PMOS capacitor 41, and an NMOS capacitor 42. A reference character IN indicates an input terminal, a reference character OUT indicates an output terminal, a reference character VDD indicates a power supply, and a reference character VSS indicates a ground power supply. The layout configuration of FIG. 16 is an example layout of the circuit configuration of FIG. 5.

As shown in FIG. 16, in the N-well 31, P-type MOS transistors (corresponding to MP11 and MP12 in FIG. 5) are provided adjacent to each other so that the gate electrodes 33 thereof are arranged in parallel to each other and the corresponding diffusion region 34 is shared. The P-type MOS transistors have the same channel width and the same channel length. In the same N-well 31, the PMOS capacitor 41 (MP1 in FIG. 5) including a P-type MOS transistor is provided adjacent to the P-type MOS transistors (MP11 and MP12 in FIG. 5).

Similar to the configuration in the N-well 31, in the P-well 32, N-type MOS transistors (corresponding to MN11 and MN12 in FIG. 5) are provided adjacent to each other so that the gate electrodes 33 thereof are arranged in parallel to each other and the corresponding diffusion region 34 is shared. The N-type MOS transistors have the same channel width and the same channel length. In the same P-well 32, the NMOS capacitor 42 (MN1 in FIG. 5) including an N-type MOS transistor is provided adjacent to the N-type MOS transistors (MN11 and MN12 in FIG. 5).

With the layout configuration of FIG. 16, in the transistors, the gate electrodes have the uniform direction and width (channel width), and there is not a step in the diffusion regions. Therefore, the transistors are substantially resistant to process variations during fabrication, and therefore, fluctuations in transistor characteristics caused by the fabrication process variations can be reduced.

The PMOS capacitor 41 and the NMOS capacitor 42 are provided adjacent to the respective transistors other than the capacitors, and have a height lower than or equal to the height (a distance indicated by a reference character Y in FIG. 16) of regions where the respective transistors other than the capacitors are formed. In this case, by increasing or decreasing the size of each capacitor only in the channel direction of the transistor, the capacitance value of the capacitor can be freely changed. Therefore, the semiconductor integrated circuit of FIG. 16 has a layout which is highly flexible and for which the delay time of the delay circuit can be easily adjusted.

In this embodiment, an example layout configuration of the circuit of FIG. 5 has been described. It is clear that the layout configuration of this embodiment is applicable to all the circuits of FIGS. 1-10.

Sixteenth Embodiment

Figure 17:
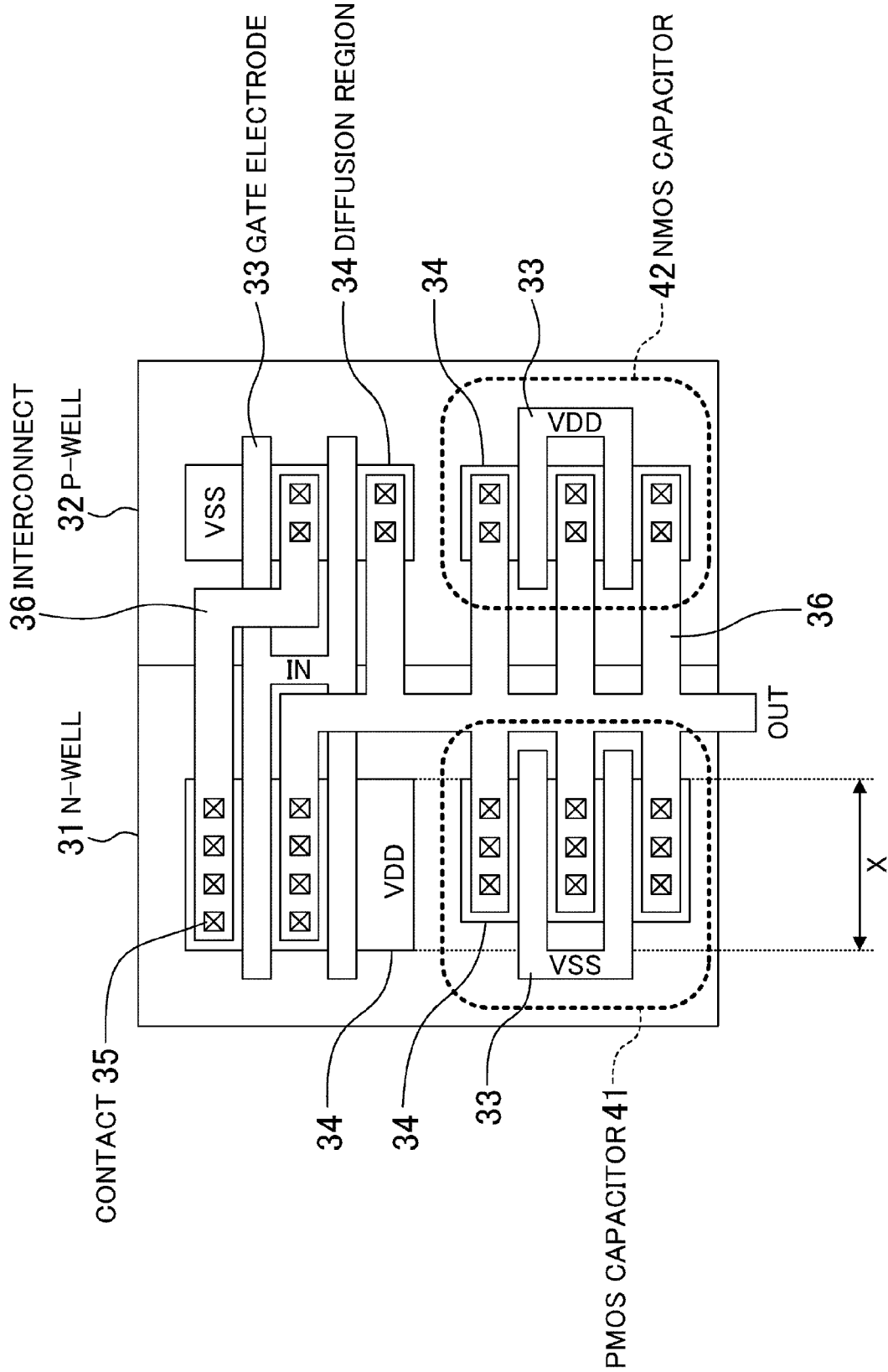
FIG. 17 is a diagram showing an example layout configuration of a semiconductor integrated circuit according to a sixteenth embodiment of the present disclosure.

FIG. 17 is a diagram showing an example layout configuration of a semiconductor integrated circuit according to a sixteenth embodiment of the present disclosure.

The semiconductor integrated circuit of FIG. 17 includes an N-well 31, a P-well 32, gate electrodes 33, diffusion regions 34, contacts 35, interconnects 36, a PMOS capacitor 41, and an NMOS capacitor 42. A reference character IN indicates an input terminal, a reference character OUT indicates an output terminal, a reference character VDD indicates a power supply, and a reference character VSS indicates a ground power supply. The layout configuration of FIG. 17 is another example layout of the circuit configuration of FIG. 5.

As shown in FIG. 17, in the N-well 31, P-type MOS transistors (corresponding to MP11 and MP12 in FIG. 5) are provided adjacent to each other so that the gate electrodes 33 thereof are arranged in parallel to each other and the corresponding diffusion region 34 is shared. The P-type MOS transistors have the same channel width and the same channel length. In the same N-well 31, the PMOS capacitor 41 (MP1 in FIG. 5) including a P-type MOS transistor is provided adjacent to the P-type MOS transistors (MP11 and MP12 in FIG. 5) in a direction perpendicular to the channel direction.

Similar to the configuration in the N-well 31, in the P-well 32, N-type MOS transistors (corresponding to MN11 and MN12 in FIG. 5) are provided adjacent to each other so that the gate electrodes 33 thereof are arranged in parallel to each other and the corresponding diffusion region 34 is shared. The N-type MOS transistors have the same channel width and the same channel length. In the same P-well 32, the NMOS capacitor 42 (MN1 in FIG. 5) including an N-type MOS transistor is provided adjacent to the N-type MOS transistors (MN11 and MN12 in FIG. 5) in the direction perpendicular to the channel direction.

With the layout configuration of FIG. 17, in the transistors, the gate electrodes have the uniform direction and width (channel width), and there is not a step in the diffusion regions. Therefore, the transistors are substantially resistant to process variations during fabrication, and therefore, fluctuations in transistor characteristics caused by the fabrication process variations can be reduced.

The PMOS capacitor 41 and the NMOS capacitor 42 are provided adjacent to the respective transistors other than the capacitors in the direction perpendicular to the channel direction, and have a width smaller than or equal to the width (a distance indicated by a reference character X in FIG. 17) of regions where the respective transistors other than the capacitors are formed. In this case, by increasing or decreasing the size of each capacitor only in the direction perpendicular to the channel direction of the transistor, the capacitance value of the capacitor can be freely changed. Therefore, the semiconductor integrated circuit of FIG. 17 has a layout which is highly flexible and for which the delay time of the delay circuit can be easily adjusted.

In this embodiment, an example layout configuration of the circuit of FIG. 5 has been described. It is clear that the layout configuration of this embodiment is applicable to all the circuits of FIGS. 1-10.

In the semiconductor integrated circuit of the present disclosure, fluctuations in the delay time of the delay circuit caused by variations in transistor characteristics can be reduced. The semiconductor integrated circuit of the present disclosure is also substantially resistant to process variations during fabrication and has excellent layout flexibility and a small area. The semiconductor integrated circuit of the present disclosure is useful as a delay circuit for semiconductor storage devices etc.

What is claimed is:

1. A semiconductor integrated circuit comprising:
   a first P-type MOS transistor and two or more N-type MOS transistors connected together in series between a first and a second power supply;
   an input terminal connected to a gate terminal of the first P-type MOS transistor and gate terminals of the two or more N-type MOS transistors;
   an output terminal which is a connection node between the first P-type MOS transistor and one of the two or more N-type MOS transistors connected to the first P-type MOS transistor;
   one or more capacitors connected to the output terminal;

the two or more N-type MOS transistors comprising a first N-type MOS transistor and a second N-type MOS transistor;
a second P-type MOS transistor having a gate terminal connected to the input terminal;
a source terminal of the second P-type MOS transistor connected to a connection node between the first N-type MOS transistor and the second N-type MOS transistor; and
a drain terminal of the second P-type MOS transistor connected to the output terminal.

2. The semiconductor integrated circuit of claim 1, wherein the substrate potentials of the first P-type MOS transistor and the two or more N-type MOS transistors are separately controlled.

3. The semiconductor integrated circuit of claim 1, further comprising:
one or more P-type MOS transistors each having a gate terminal connected to the input terminal, and each connected between a connection node between the corresponding two of the two or more N-type MOS transistors connected together in series and the first power supply.

4. The semiconductor integrated circuit of claim 1, wherein the one or more capacitors each include at least one P-type or N-type MOS transistor, and
if at least one of the one or more capacitors includes the P-type MOS transistor and at least another one of the one or more capacitors includes the N-type MOS transistor, the capacitance value of the at least one capacitor including the P-type MOS transistor is smaller than the capacitance value of the at least one capacitor including the N-type MOS transistor.

5. The semiconductor integrated circuit of claim 1, wherein the one or more capacitors each include at least one P-type or N-type MOS transistor, and
if at least one of the one or more capacitors includes the P-type MOS transistor and at least another one of the one or more capacitors includes the N-type MOS transistor, the product of the channel length and channel width of the at least one capacitor including the P-type MOS transistor is smaller than the product of the channel length and channel width of the at least one capacitor including the N-type MOS transistor.

6. The semiconductor integrated circuit of claim 1, wherein the semiconductor integrated circuit is mounted in a semiconductor storage device, a polarity of the two or more N-type transistors connected together in series is the same as a polarity of one or more third MOS transistors connected together in series between a bit line and the first or second power supply in the semiconductor storage device, one of the third transistors being connected to the bit line.

7. The semiconductor integrated circuit of claim 1, wherein the semiconductor integrated circuit is mounted in a semiconductor storage device, the number of the two or more N-type MOS transistors connected together in series is the same as the number of third transistors connected together in series between a bit line and the first or second power supply in the semiconductor storage device.

8. The semiconductor integrated circuit of claim 1, wherein the semiconductor integrated circuit is mounted in a semiconductor storage device, an impurity concentration of the two or more N-type MOS transistors connected together in series is the same as an impurity concentration of third transistors connected together in series between a bit line in the semiconductor storage device.

9. The semiconductor integrated circuit of claim 1, wherein when the semiconductor integrated circuit is mounted in a semiconductor storage device in which a potential of a memory array is different from a potential of a portion thereof other than the memory array, the first potential applied to the semiconductor integrated circuit is equal to the potential of the memory array.

10. The semiconductor integrated circuit of claim 1, wherein the semiconductor integrated circuit is used as a delay circuit which generates a timing signal for activating a sense amplifier circuit which amplifies data read from a memory cell in a semiconductor storage device.

11. The semiconductor integrated circuit of claim 1, wherein
the semiconductor integrated circuit is used as a delay circuit which generates a timing signal for writing data to a memory cell in a semiconductor storage device.

12. The semiconductor integrated circuit of claim 1, wherein
the one or more P-type MOS transistors other than the P-type MOS transistors included in the one or more capacitors have the same channel width and the same channel length, and
the one or more N-type MOS transistors other than the N-type MOS transistors included in the one or more capacitors have the same channel width and the same channel length.

13. The semiconductor integrated circuit of claim 1, wherein
the one or more P-type MOS transistors other than the P-type MOS transistors included in the one or more capacitors have gate electrodes arranged in parallel to each other,
a diffusion region shaped by at least the one or more P-type MOS transistors other than the P-type MOS transistors included in the one or more capacitors is in the shape of a rectangle,
the one or more N-type MOS transistors other than the N-type MOS transistors included in the one or more capacitors have gate electrodes arranged in parallel to each other, and
a diffusion region shaped by at least the one or more N-type MOS transistors other than the N-type MOS transistors included in the one or more capacitors is in the shape of a rectangle.

14. The semiconductor integrated circuit of claim 13, wherein
a P-well and an N-well are provided and separated from each other in a direction perpendicular to the channel direction of the transistors,
the P-type MOS transistors other than those included in the capacitors are provided in the P-well, and the N-type MOS transistors other than those included in the capacitors are provided in the N-well,
the capacitors are provided adjacent to the P-type MOS transistors or the N-type MOS transistors, and
the capacitors are provided in a region having a length in the direction perpendicular to the transistor channel direction which is smaller than or equal to that of a region where the P-type MOS transistors or the N-type MOS transistors are formed.

15. The semiconductor integrated circuit of claim 14, wherein
the capacitance value of the capacitor is changed by changing a size thereof in the same direction as the transistor channel direction while keeping a length thereof in the direction perpendicular to the transistor channel direction.

16. The semiconductor integrated circuit of claim 13, wherein
- a P-well and an N-well are separated from each other in a direction perpendicular to the channel direction of the transistors,
- the P-type MOS transistors other than those included in the capacitors are provided in the P-well, and the N-type MOS transistors other than those included in the capacitors are provided in the N-well,
- the capacitors are provided adjacent to the P-type MOS transistors or the N-type MOS transistors, and
- the capacitors are provided in a region having a length in the same direction as the transistor channel direction which is smaller than or equal to that of a region where the P-type MOS transistors or the N-type MOS transistors are formed.

17. The semiconductor integrated circuit of claim 16, wherein
- the capacitance value of the capacitor is changed by changing a size thereof in the direction perpendicular to the transistor channel direction while keeping a length thereof in the same direction as the transistor channel direction.

\* \* \* \* \*